(12) United States Patent
Krishnamurthy et al.

(10) Patent No.: US 12,061,103 B2
(45) Date of Patent: Aug. 13, 2024

(54) PACKAGING DESIGN FOR A FLOW SENSOR AND METHODS OF MANUFACTURING THEREOF

(71) Applicant: APPLIED MATERIALS, INC., Santa Clara, CA (US)

(72) Inventors: Srikanth Krishnamurthy, Bangalore (IN); Ming Xu, San Jose, CA (US); Ashley M. Okada, San Jose, CA (US); Ramachandra Murthy Gunturi, Bangalore (IN); Vijay Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 423 days.

(21) Appl. No.: 17/316,622

(22) Filed: May 10, 2021

(65) Prior Publication Data
US 2022/0357187 A1    Nov. 10, 2022

(51) Int. Cl.
*G01F 1/20*    (2006.01)
*C23C 16/40*    (2006.01)
(Continued)

(52) U.S. Cl.
CPC .............. *G01F 1/20* (2013.01); *C23C 16/403* (2013.01); *C23C 16/45525* (2013.01);
(Continued)

(58) Field of Classification Search
CPC ....... G01F 1/20; G01F 1/6845; C23C 16/403; C23C 16/45525; H01J 37/244;
(Continued)

(56) References Cited

U.S. PATENT DOCUMENTS

| 5,182,952 A | 2/1993 | Pyzik |
| 6,588,268 B1 * | 7/2003 | Yamagishi .............. G01F 1/699 |
| | | 73/204.26 |

(Continued)

FOREIGN PATENT DOCUMENTS

| EP | 1035406 A1 | 9/2000 |
| WO | 2012-153454 A1 | 11/2012 |

OTHER PUBLICATIONS

PCT International Search Report and Written Opinion for International Application No. PCT/US2022/028390 mailed Aug. 23, 2022, 13 pages.

*Primary Examiner* — Nathaniel T Woodward
(74) *Attorney, Agent, or Firm* — Lowenstein Sandler LLP

(57) ABSTRACT

Disclosed herein are embodiments of a sensor assembly, methods of manufacturing the same, and methods of using the same. In one embodiment, a sensor assembly comprises a substrate comprising an outer region, an inner region, and a middle region positioned between the outer region and the inner region, the substrate further comprising electrical contact pads on at least the inner region. The sensor assembly further comprises a housing coupled to the substrate at the outer region or at the middle region to form a hermetic seal. The sensor assembly further comprises a sensor device coupled to the substrate, via the electrical contact pads, at the inner region. In certain embodiments, the sensor assembly further comprises a conformal coating deposited on at least a portion of the sensor assembly.

13 Claims, 17 Drawing Sheets

(51) Int. Cl.
*C23C 16/455* (2006.01)
*H01J 37/244* (2006.01)
*H01J 37/32* (2006.01)
*H01L 21/67* (2006.01)
*H05K 3/30* (2006.01)

(52) U.S. Cl.
CPC ...... *H01J 37/244* (2013.01); *H01J 37/32449* (2013.01); *H01L 21/67253* (2013.01); *H05K 3/303* (2013.01); *H01J 2237/24585* (2013.01)

(58) Field of Classification Search
CPC ....... H01J 37/32449; H01J 2237/24585; H01J 37/32935; H01L 21/67253; H05K 3/303; G01D 11/24
USPC ...................................................... 73/861.08
See application file for complete search history.

(56) References Cited

U.S. PATENT DOCUMENTS

| | | | |
|---|---|---|---|
| 8,359,902 B2 * | 1/2013 | Thanigachalam | G01N 27/12 73/23.31 |
| 2002/0166618 A1 * | 11/2002 | Wolf | A61N 1/3754 156/89.12 |
| 2004/0200291 A1 * | 10/2004 | Dai | G01L 9/0055 73/766 |
| 2010/0224980 A1 * | 9/2010 | Chahal | H01L 28/40 257/E23.18 |
| 2012/0192645 A1 | 8/2012 | Beck et al. | |
| 2013/0319762 A1 * | 12/2013 | Harris | H05K 13/00 156/60 |
| 2013/0327123 A1 * | 12/2013 | Suzuki | H05B 3/02 73/23.31 |
| 2018/0372522 A1 | 12/2018 | Gaberthüel et al. | |
| 2023/0314193 A1 * | 10/2023 | Parkhe | G01F 1/688 73/861.08 |
| 2023/0314197 A1 * | 10/2023 | Chadha | B81B 7/0058 73/292 |

* cited by examiner

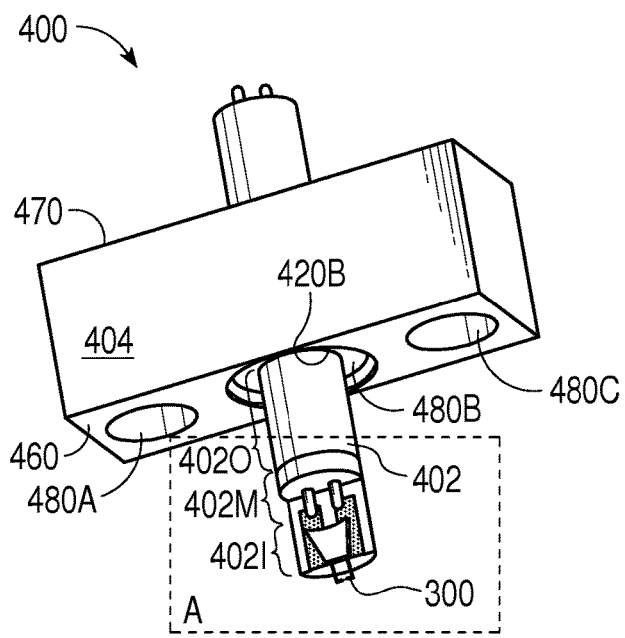 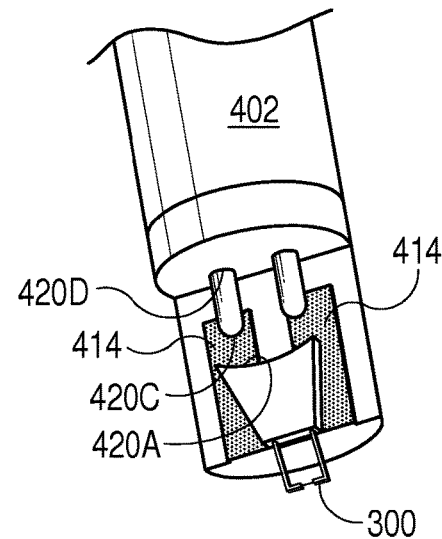
FIG. 4A  FIG. 4B
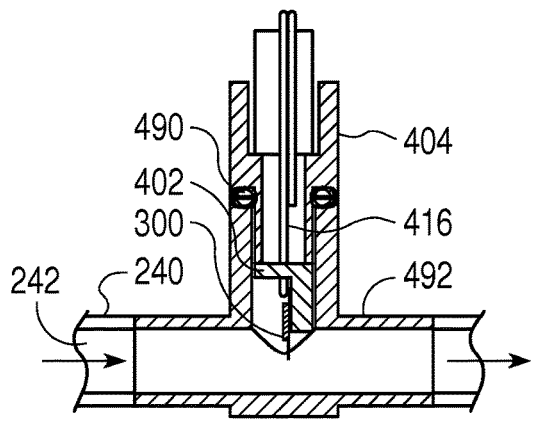
FIG. 4C
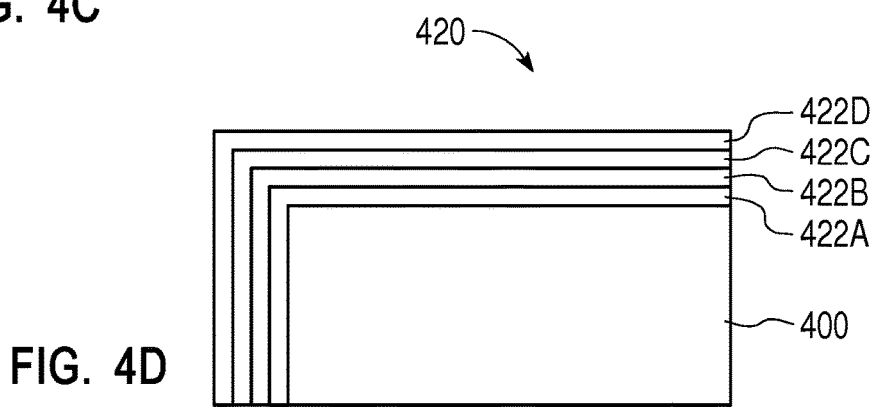
FIG. 4D

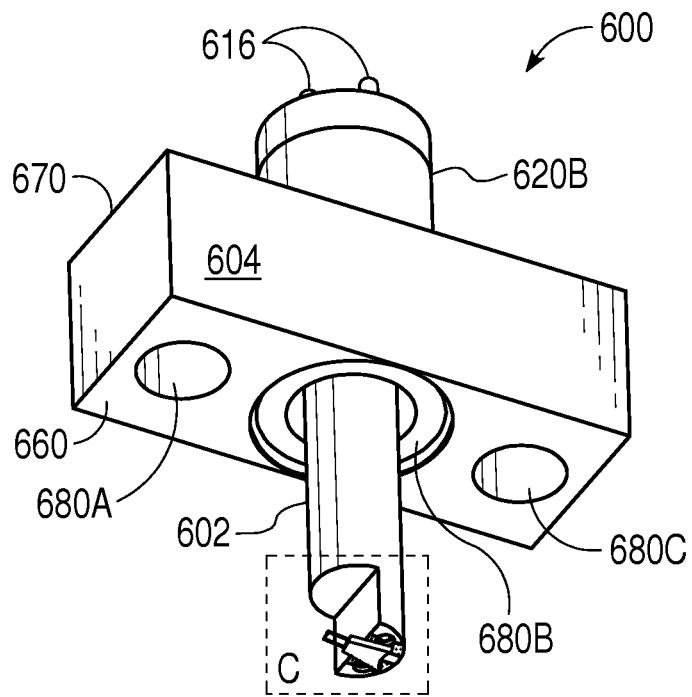
FIG. 6A
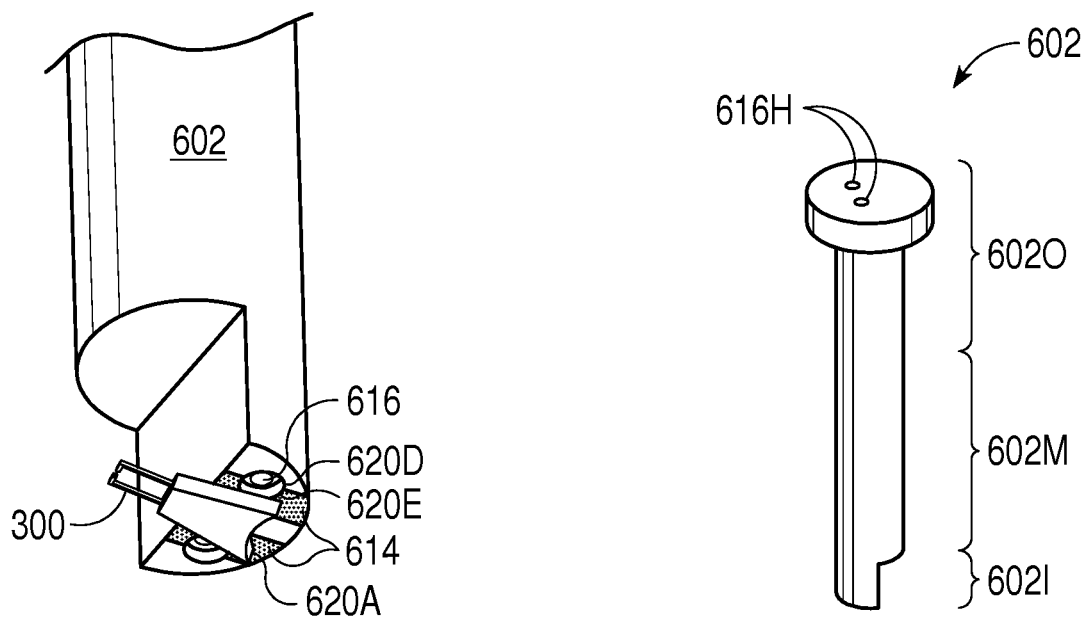
FIG. 6B
FIG. 6C

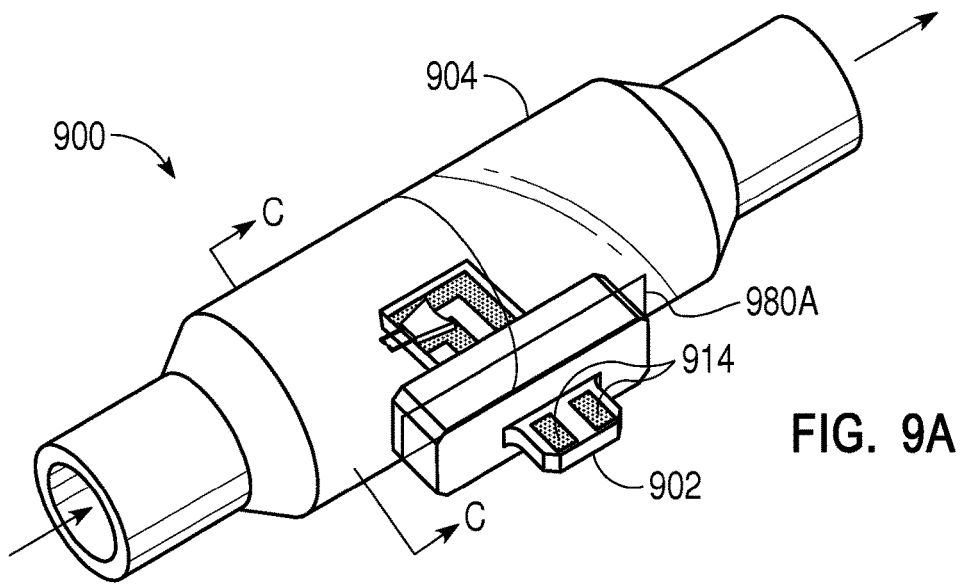
FIG. 9A
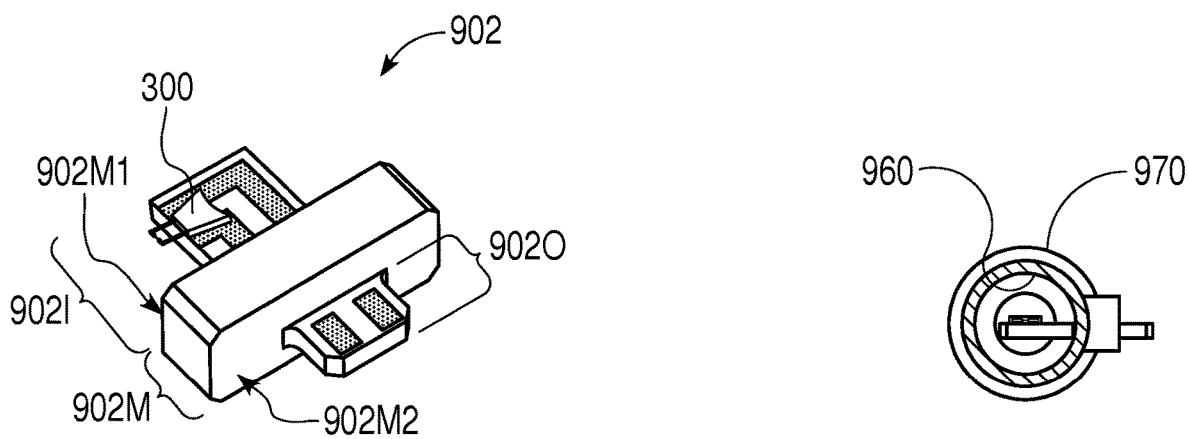
FIG. 9B
FIG. 9C

PACKAGING DESIGN FOR A FLOW SENSOR AND METHODS OF MANUFACTURING THEREOF

TECHNICAL FIELD

Embodiments of the present disclosure relate, in general, to a sensor for monitoring and controlling, e.g., a flow rate of a gas.

BACKGROUND

Various manufacturing systems (e.g., for semiconductor applications) may include measurements of gas flow properties (e.g., flow rate, temperature, pressure, and the like). The sensors used for taking such measurements may not be compatible with aggressive environments that may be used in certain manufacturing systems (e.g., corrosive environment, environment with high energy plasma, environment with a vacuum, environment with a high temperature and/or frequent temperature cycles, and the like). Making sensors and/or sensor packaging with a special geometry that does not adversely affect the process gas properties, while also being compatible with certain aggressive environments may present challenges.

For example, in some manufacturing systems, process gases (e.g., gases used during semiconductor fabrication processes) and/or cleaning gases (e.g., gases used to clean a manufactured device and/or a chamber used in manufacturing an electronic device) may have precise delivery targets including high mass flow rates as well as the ability to precisely control low flow rates. Conventional manufacturing systems often use one or more mass flow controllers (MFCs) to measure and control the mass flow rates of process gases.

It would be advantageous to develop MFCs and/or other sensors that are compatible with aggressive manufacturing environments (e.g., resistant to corrosion and/or material contamination), maintain a vacuum seal, robust, have a long operational life, reliable, and have a geometry that minimizes adverse effects on gas flow properties.

SUMMARY

Certain embodiments of the present disclosure relate to a sensor assembly including a substrate, a housing, and a sensor device. In certain embodiments, the substrate includes an outer region, an inner region, and a middle region positioned between the outer region and the inner region. In certain embodiments, the substrate further includes electrical contact pads on at least the inner region. In certain embodiments, the housing is coupled to the substrate at the outer region to provide a hermetic seal. In certain embodiments, the sensor device is coupled to the substrate, via the electrical contact pads, at the inner region.

In another aspect of the present disclosure, the sensor assembly includes a multi-layered ceramic substrate that includes an outer region, an inner region, and a middle region positioned between the outer region and the inner region. The multi-layered ceramic substrate may further include electrical contact pads formed between layers of the multi-layered ceramic substrate, wherein the electrical contact pads extend throughout the multi-layered ceramic substrate from the outer region to the inner region. In certain embodiments, the sensor assembly further includes a housing coupled to the substrate at the middle region to form a hermetic seal. In certain embodiments, the sensor assembly further includes a sensor device coupled to the substrate, via the electrical contact pads, at the inner region.

In another aspect of the present disclosure, the sensor assembly includes a multi-layered ceramic substrate with a first end and a second end opposite the first end. In certain embodiments, the first end of the multi-layered ceramic substrate includes a first outer region, an inner region, and a first middle region positioned between the first outer region and the inner region. In certain embodiments, the second end of the multi-layered ceramic substrate includes a second outer region and a second middle region positioned between the second outer region and the inner region. In certain embodiments, the multi-layered ceramic substrate includes electrical contact pads formed between layers of the multi-layered ceramic substrate, the electrical contact pads extending throughout the multi-layered ceramic substrate from the first end to the second end. In certain embodiments, the sensor assembly further includes a housing coupled to the multi-layered ceramic substrate at the first middle region and at the second middle region to form a hermetic seal. In certain embodiments, the sensor assembly further includes a sensor device coupled to the substrate, via the electrical contact pads, at the inner region. In certain embodiments, the sensor assembly further includes a conformal coating deposited on at least a portion of the sensor assembly.

Certain embodiments of the present disclosure relate to a method of manufacturing a sensor assembly. In certain embodiments, the method of manufacturing a sensor assembly includes providing a substrate including an outer region, an inner region, and a middle region positioned between the outer region and the inner region, wherein the substrate further includes electrical contact pads on at least the inner region. In certain embodiments, the method of manufacturing a sensor assembly further includes coupling a sensor device to the substrate at the inner region. In certain embodiments, the method of manufacturing a sensor assembly further includes coupling the substrate to the housing at the outer region to form a hermetic seal.

In another aspect of the present disclosure, the method of manufacturing a sensor assembly includes providing a multi-layered ceramic substrate including an outer region, an inner region, and a middle region positioned between the outer region and the inner region, wherein the multi-layered ceramic substrate includes electrical contact pads formed between layers of the multi-layered ceramic substrate, and wherein the electrical contact pads extend throughout the multi-layered ceramic substrate from the outer region to the inner region. In certain embodiments, the method of manufacturing a sensor assembly further includes coupling a sensor device to the electrical contact pads at the inner region of the multi-layered ceramic substrate. In certain embodiments, the method of manufacturing a sensor assembly further includes inserting the multi-layered ceramic substrate coupled to the sensor device into a housing. In certain embodiments, the method of manufacturing a sensor assembly further includes coupling the multi-layered ceramic substrate to the housing at the middle region such that the substrate is configured in a cantilever position to form a hermetic seal.

In another aspect of the present disclosure, the method of manufacturing a sensor assembly includes providing a multi-layered ceramic substrate including a first end, a second end opposite the first end, and an inner region between the first end and the second end, wherein the first end includes a first outer region and a first middle region positioned between the first outer region and the inner region, wherein the second end includes a second outer region and a second middle region positioned between the second outer region and the inner region, and wherein the multi-layered ceramic substrate includes electrical contact pads formed between layers of the multi-layered ceramic substrate, the electrical contact pads extending throughout the multi-layered ceramic substrate from the first end to the second end. In certain embodiments, the method of manufacturing a sensor assembly further includes coupling a sensor device to the electrical contact pads at the inner region of the multi-layered ceramic substrate. In certain embodiments, the method of manufacturing a sensor assembly further includes inserting the multi-layered ceramic substrate coupled to the sensor device into a housing. In certain embodiments, the method of manufacturing a sensor assembly further includes coupling the multi-layered ceramic substrate to the housing at the first middle region and at the second middle region such that the substrate is extended from one end of the housing to a second opposing end of the housing to form a hermetic seal. In certain embodiments, the method of manufacturing a sensor assembly further includes depositing a conformal coating on at least a portion of the sensor assembly.

Certain embodiments of the present disclosure relate to a flow control apparatus. In certain embodiments, the flow control apparatus includes a gas flow channel defining a gas flow path, a flow modulating valve configured to modulate gas flow in the gas flow channel, a sensor assembly coupled to the gas flow channel, and a processing device. In certain embodiments, the sensor assembly includes a substrate, a housing, a sensor device, and a conformal coating deposited on at least a portion of the sensor assembly. In certain embodiments, the substrate includes an outer region, an inner region, and a middle region positioned between the outer region and the inner region, wherein the substrate further includes electrical contact pads on at least the inner region. In certain embodiments, the housing is coupled to the substrate at the middle region or at the outer region to form a hermetic seal. In certain embodiments, the sensor device is coupled to the substrate, via the electrical contact pads, at the inner region. In certain embodiments, the processing device is operatively coupled to the flow modulating valve and the sensor device, and is configured to adjust the flow control valve based on signals from the sensor device.

BRIEF DESCRIPTION OF DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 1 also provides an exemplary illustration that a sensor assembly, in accordance with embodiments of the present disclosure, could be incorporated into various locations in a processing chamber and/or in a manufacturing system.

FIG. 4A illustrates a perspective view of a sensor assembly, in accordance with embodiments of the present disclosure.

FIG. 4B illustrates a blown up view of region A in FIG. 4A.

FIG. 4C illustrates a cross-sectional side view of an exemplary flow channel with the sensor assembly of FIG. 4A mounted thereon, in accordance with embodiments of the present disclosure.

FIG. 4D illustrates a cross-sectional view of a conformal coating formed on surfaces of an exemplary sensor assemblies in accordance with embodiments of the present disclosure.

FIG. 6A illustrates a perspective view of a sensor assembly in accordance with embodiments of the present disclosure.

FIG. 6B illustrates a blown up view of region C in FIG. 6A.

FIG. 6C illustrates a perspective view of a substrate included in the sensor assembly of FIG. 6A in accordance with embodiments of the present disclosure.

FIG. 9A illustrates a perspective view of a sensor assembly in accordance with embodiments of the present disclosure.

FIG. 9B illustrates a perspective view of a multi-layered ceramic substrate included in the sensor assembly of FIG. 9A with a sensor device coupled thereto at the inner region, in accordance with embodiments of the present disclosure.

FIG. 9C illustrates a front view of section C-C in FIG. 9A.

DETAILED DESCRIPTION OF EMBODIMENTS

Figure 1:
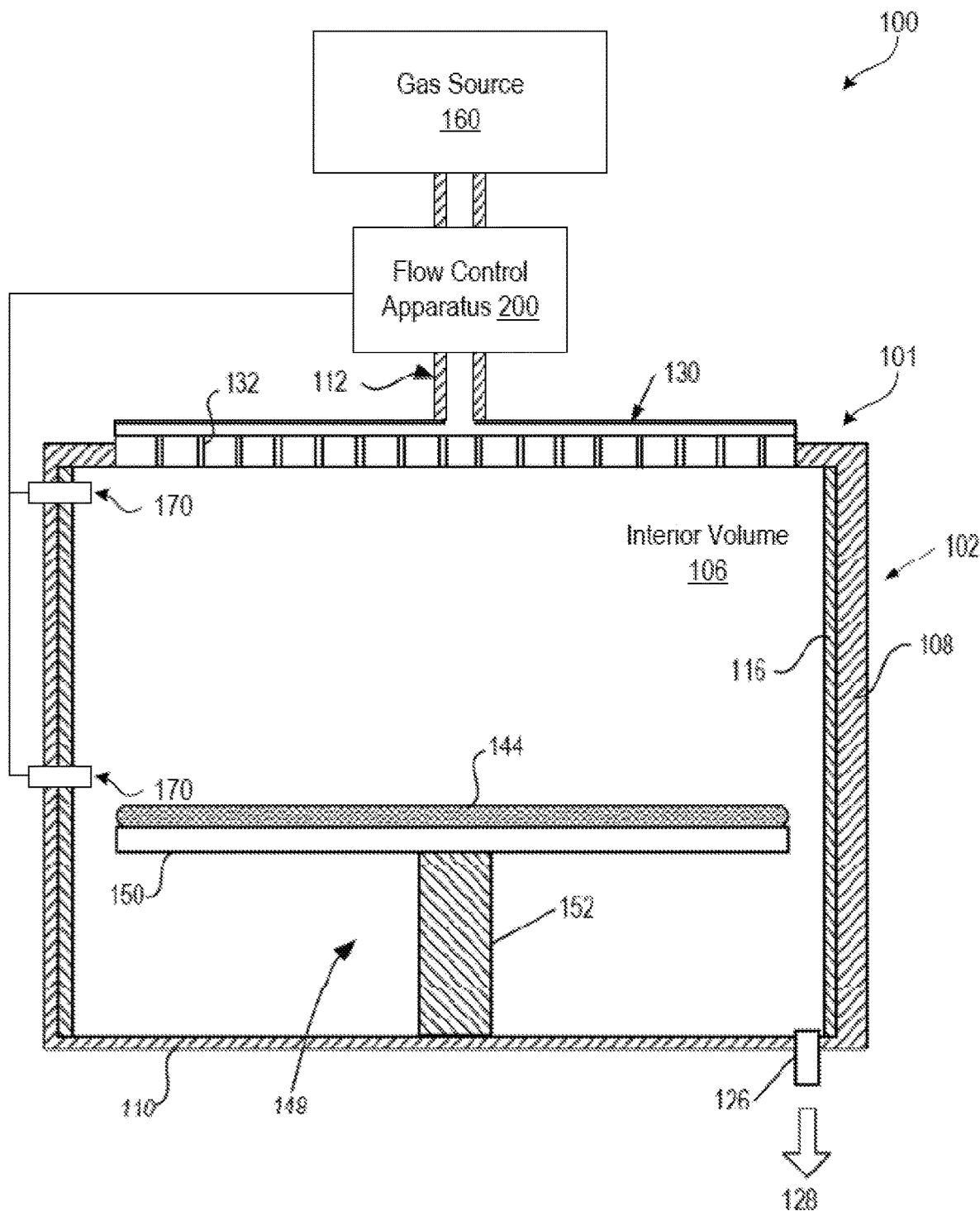
FIG. 1 illustrates an exemplary system that includes a processing chamber, a gas source, and a flow control apparatus, in accordance with embodiments of the present disclosure.

Embodiments described herein relate to a sensor assembly (also may be referred to as sensor packaging) adapted for use in a mass flow control apparatus, a system incorporating the same, a method of adapting the sensor assembly for such use, and a method of using the sensor assembly. In certain embodiments, the sensor assembly may also be adapted for uses other than as part of a mass flow control apparatus. For instance, the sensor assembly may be adapted for use for temperature control, pressure control, and the like. The sensor assembly includes, in some embodiments, a sensor device (such as a MEMS device, Hot-Wire Anemometry (HWA), or any other suitable sensor) having a free-standing sensing element that is to be disposed directly in the flow path of a gas flow channel. The sensor assembly also includes, in some embodiments, a substrate to which the sensor device is secured (e.g., via a metal seal). The sensor assembly also includes, in some embodiments, a housing to which the substrate is secured (e.g., via a metal seal). In certain embodiments, the sensor device may be secured to the substrate via a metal seal (e.g., through soldiering or brazing with a brazing alloy) and the substrate may be secured to the housing via another metal seal (e.g., through soldiering or brazing with a brazing alloy). In certain embodiments, an o-ring may be further disposed between the substrate and the housing. In certain embodiments, the various components of the sensor assembly are assembled together in a manner that provides a hermetic seal between the substrate, to which the sensor device is secured, and the housing, to which the substrate is secured at the substrate's outer region or at the substrate's middle region. In certain embodiments, the various components of the sensor assembly may be connected in a manner that establishes continuous electric conductivity from the free-standing sensing element, through the sensor assembly, to one or more external devices (such as a processing device) such that the properties measured by the sensing element can be transmitted to the processing device. The various components of the sensor assembly may also be connected in a manner that minimizes turbulence effects of flow on sensor measurement and/or provide hermetic sealing to accommodate high vacuum and minimize outgassing or leakage. The sensor assembly also includes, in some embodiments, a conformal coating (on part of the assembly or on the entire assembly) to protect various portions of the sensor assembly from corrosive gases.

In general, it is advantageous to precisely control the temperature and flow rate of a process gas used in a manufacturing process to better control the process and to allow precise processing constraints to be met. The low transient response rates of current flow sensors are unsuitable for applications that require precise control of gas dosing, such as the delivery of small quantities of gas as well as pulses of one or more gases in succession.

Embodiments of the present disclosure advantageously overcome the limitations of current sensors by utilizing a sensor device (such as a MEMS device, Hot-Wire Anemometry (HWA), or any other suitable sensor) directly within the flow path of the gas to provide fast and accurate flow feedback. In addition to flow feedback, the sensor device may be advantageously utilized to provide fast and accurate temperature measurements at any location of a gas supply line, including at the source, near the valve, near an entrance to a process chamber (e.g., a point of delivery), within the process chamber, or in the foreline. The temperature measurements may be monitored in real-time by the processing device, which may in turn transmit power output commands to heating units at different locations of the gas supply line.

Certain embodiments advantageously adapt the sensor device(s) to be inserted directly into a gas flow path while protecting the sensor device(s) from corrosive chemistries. For example, embodiments described herein relate to a sensor assembly and materials for a sensor assembly that may be exposed to corrosive chemistries, such as those used during semiconductor processing. Sensor assemblies described herein may be adapted to protect the sensor device from corrosive chemistries while still maintaining the electrical properties (e.g., establish electrical conductivity to the sensor), relative shape, and geometric configuration of the sensor device. In one embodiment, a sensing element is positioned (e.g., nanowire portion) in the sensor device in a way that it is exposed to the flow path and can provide accurate measurements of the gas flow. The sensor assembly may also be adapted to minimize turbulence effects of flow on the sensor device measurements, minimize corrosion, minimize depositions on the sensor die which could hamper sensor performance, minimize outgassing or leakage to the external environment, maintain vacuum, retain thermal properties, retain the sensitivity and/or measurement accuracy of the sensor device, and retain the fast response of the sensor device.

FIG. 1 depicts a system 100 that includes a processing chamber 101, a gas source 160, and a flow control apparatus 200 in accordance with embodiments of the present disclosure. The processing chamber 101 may be used for processes in which a corrosive plasma environment is provided. For example, the processing chamber 101 may be a chamber for a plasma etcher or plasma etch reactor, a plasma cleaner, and so forth. In alternative embodiments, other processing chambers may be used, which may or may not be exposed to a corrosive plasma environment. Some examples of chamber components include a chemical vapor deposition (CVD) chamber, a physical vapor deposition (PVD) chamber, an ALD chamber, an IAD chamber, an etch chamber, and other types of processing chambers. In some embodiments, processing chamber 101 may be any chamber used in an electronic device manufacturing system.

In one embodiment, the processing chamber 101 includes a chamber body 102 and a showerhead 130 that encloses an interior volume 106. The showerhead 130 may include a showerhead base and a showerhead gas distribution plate (GDP), which may have multiple gas delivery holes 132 (also referred to herein as channels) throughout the GDP. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel, or other suitable material such as titanium. The chamber body 102 generally includes sidewalls 108 and a bottom 110.

An outer liner 116 may be disposed adjacent the sidewalls 108 to protect the chamber body 102. The outer liner 116 may be fabricated to include one or more apertures. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 101.

The gas source 160 may be coupled to the processing chamber 101 to provide process and/or cleaning gases via supply line 112 to the interior volume 106 through a showerhead 130. The flow control apparatus 200 may be coupled to the gas source 160 and processing chamber 101. The flow control apparatus 200 may be used to measure and control the flow of gas from the gas source 160 to interior volume 106. An exemplary flow control apparatus 200 is described in greater detail below with respect to FIG. 2. In some embodiments, one or more gas panels 160 may be coupled to processing chamber 101 to provide gases to the interior volume 106. In such embodiments, one or more flow control systems 200 may be coupled to each gas source 160 and processing chamber 101. In other embodiments, a single flow control apparatus 200 may be coupled to one or more gas panels 160. In some embodiments, the flow control apparatus 200 may comprise a flow ratio controller to control the flow of gases to the processing chamber 101 (e.g., through one or more supply lines 112), or to other processing chambers.

The showerhead 130 may be supported on the sidewall 108 of the chamber body 102. The showerhead 130 (or lid) may be opened to allow access to the interior volume 106 of the processing chamber 101, and may provide a seal for the processing chamber 101 while closed. The gas source 160 may be coupled to the processing chamber 101 to provide process and/or cleaning gases to the interior volume 106 through the showerhead 130 or lid and nozzle (e.g., through apertures of the showerhead or lid and nozzle).

In some embodiments, one or more sensor assemblies 170 may be disposed within the interior volume 106. For example, one or more sensor assemblies 170 may be located near (e.g., within 10 centimeters of) the showerhead 130. As another example, one or more sensor devices may be located near (e.g., within 10 centimeters of) the substrate 144, which may be used to monitor conditions near the reaction site.

In one embodiment, the substrate support assembly 148 includes a pedestal 152 that supports an electrostatic chuck 150. The electrostatic chuck 150 further includes a thermally conductive base and an electrostatic puck bonded to the thermally conductive base by a bond, which may be a silicone bond in one embodiment. The thermally conductive base and/or electrostatic puck of the electrostatic chuck 150 may include one or more optional embedded heating elements, embedded thermal isolators, and/or conduits to control a lateral temperature profile of the substrate support assembly 148. The electrostatic puck may further include multiple gas passages such as grooves, mesas, and other surface features that may be formed in an upper surface of the electrostatic puck. The gas passages may be fluidly coupled to a source of a heat transfer (or backside) gas such as helium via holes drilled in the electrostatic puck. In operation, the backside gas may be provided at controlled pressure into the gas passages to enhance the heat transfer between the electrostatic puck and a supported substrate 144. The electrostatic chuck 150 may include at least one clamping electrode controlled by a chucking power source.

Figure 2:
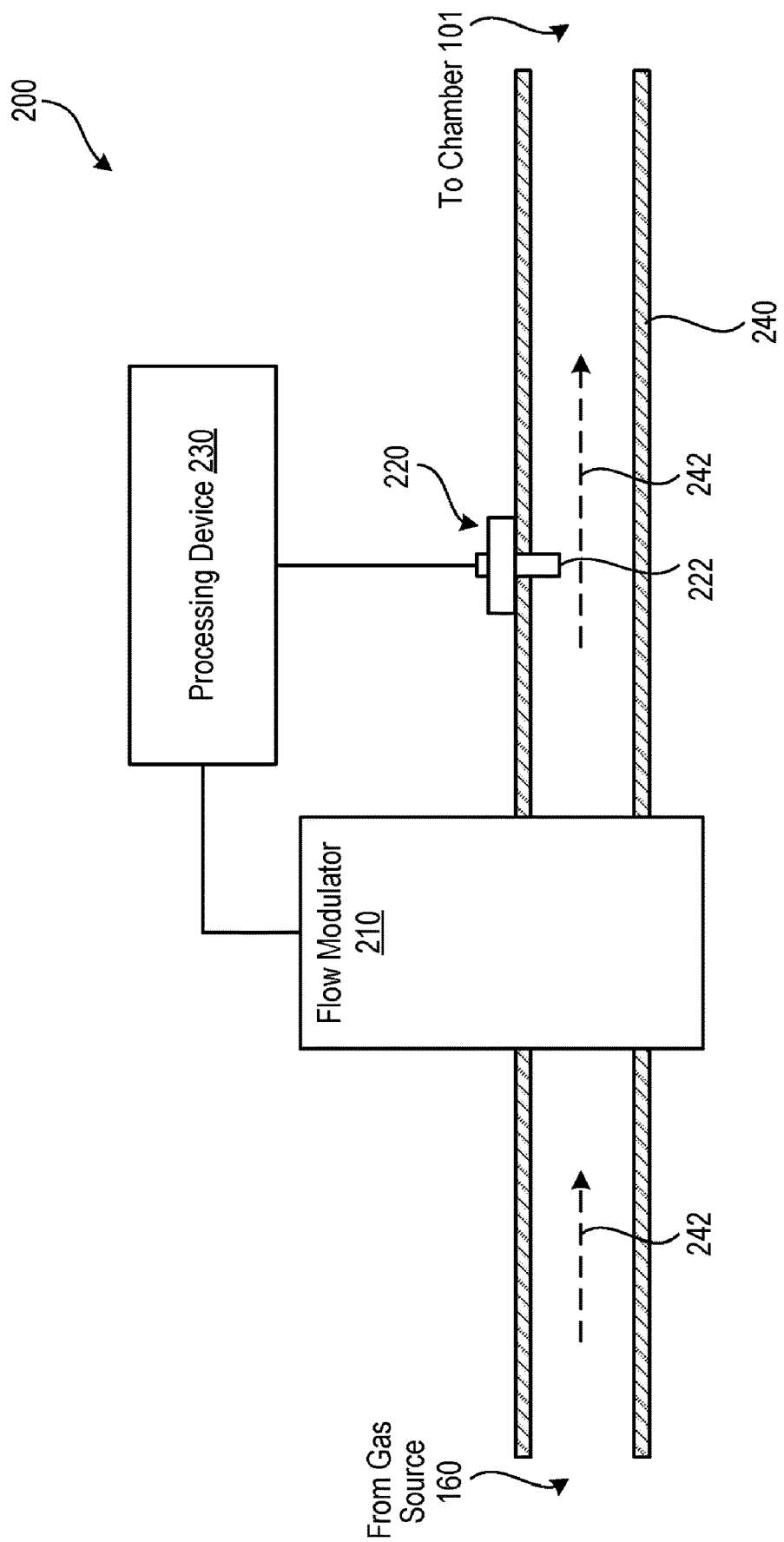
FIG. 2 illustrates an exemplary flow control apparatus, in accordance with embodiments of the present disclosure.

FIG. 2 depicts a flow control apparatus 200 in accordance with embodiments of the present disclosure. The flow control apparatus 200 may be configured to measure and control a mass flow rate of a process gas and/or a cleaning gas used in a manufacturing system, and thus may be considered a type of WC. The flow control apparatus 200 may be coupled to the gas source 160 and the chamber 101 via a gas flow channel 240. The gas flow channel may correspond to the supply line 112 of FIG. 1. In some embodiments, the flow control apparatus 200 may be incorporated into a flow ratio controller or a pulsed mass flow system.

In some embodiments, flow control apparatus 200 may include at least a flow modulator 210, a sensor assembly 220, and a processing device 230. Gas from the gas source 160 flows through the flow path 242 defined through gas flow channel 240 through the flow modulator 210, and to the chamber 101. In other embodiments, the gas flow channel 240 may terminate somewhere other than at the chamber 101. For example, the gas flow channel 240 may deliver gas to an open environment (e.g., an exhaust system) or a closed environment (e.g., a building or vehicle ventilation system). In some embodiments, the gas flow channel 240 is a gas line, an offshoot channel of a gas line, or a separate component with inlets and outlets fitted to the gas line.

In some embodiments, the flow modulator 210 is configured to restrict the gas flow through the flow path 242, and may comprise one or more flow modulating valves which may each be an actuatable valve such as, for example, a solenoid valve or a piezoelectric valve. In some embodiments, the flow modulator includes other components in addition to a valve, such as flow or temperature sensing components. In some embodiments, the flow modulator 210 functions as an MFC, such as a thermal-based MFC, a pressure-based MFC, or a rate-of-decay-based MFC.

In some embodiments where the flow modulator 210 functions as a thermal-based MFC, the flow modulator 210 includes a capillary bypass channel that branches off from the gas flow channel 240. Temperature sensors at the beginning and end of the capillary are used to compute (e.g., by the processing device 230 or an on-board processing device) a temperature delta, which is proportional to the gas flow rate.

In some embodiments, the sensor assembly 220 is disposed downstream from the flow modulator 210. The sensor assembly 220 may be a part of the flow modulator 210 (e.g., adjacent to the flow modulating valve of the flow modulator 210), near (e.g., within 10 centimeters of) the flow modulator 210, near (e.g., within 10 centimeters of) an inlet of the chamber 101 or the showerhead 130, or within the chamber 101 (as illustrated in FIG. 1 with respect to sensor assemblies 170, which may be the same or similar to the sensor assembly 220).

In some embodiments, the sensor assembly 220 comprises a sensor device 222, which may be configured to generate one or more signals responsive to conditions of the gas flow. For example, the sensor device 222 may be configured to generate one or more signals indicative of a gas temperature or a gas flow rate. Exemplary sensor assemblies are described in greater detail below with respect to FIGS. 4A through 10C. In some embodiments, the sensor assembly 220 is coupled to the gas flow channel 240 such that the sensor device 222 is inserted directly into the flow path 242. The sensor assembly 220 is coupled to the gas flow channel such that a seal is formed to prevent gas leakage. In some embodiments, the sensor assembly 220 also includes a housing to which a substrate and a sensor device 222 (e.g., a MEMS device, Hot-Wire Anemometry (HWA), or any other suitable sensor) are secured via a seal (e.g., a metal seal).

In some embodiments, the processing device 230 includes a central processing unit (CPU), microcontroller, a programmable logic controller (PLC), a system on a chip (SoC), a server computer, or other suitable type of computing device. The processing device 230 may be configured to execute programming instructions related to the operation of the flow modulator 210. The processing device 230 receives feedback signals from the sensor device 222 and, optionally, the flow modulator 210, and computes temperature, flow rate, and/or other parameters of the gas flow. The processing device 230 further transmits control signals to the flow modulator 210 based on the received feedback signals. In some embodiments, the processing device 230 is configured for high-speed feedback processing, and may include, for example, an EPM. In some embodiments, the processing device is configured to execute a process recipe, or one or more steps of a process recipe, for a fabrication process using the chamber 101. For example, the recipe may specify gas flows at particular flow rates to occur at specific times, for specific durations, and for specific gases. As another example, the recipe may specify pulses of one or more gases.

Figure 3:
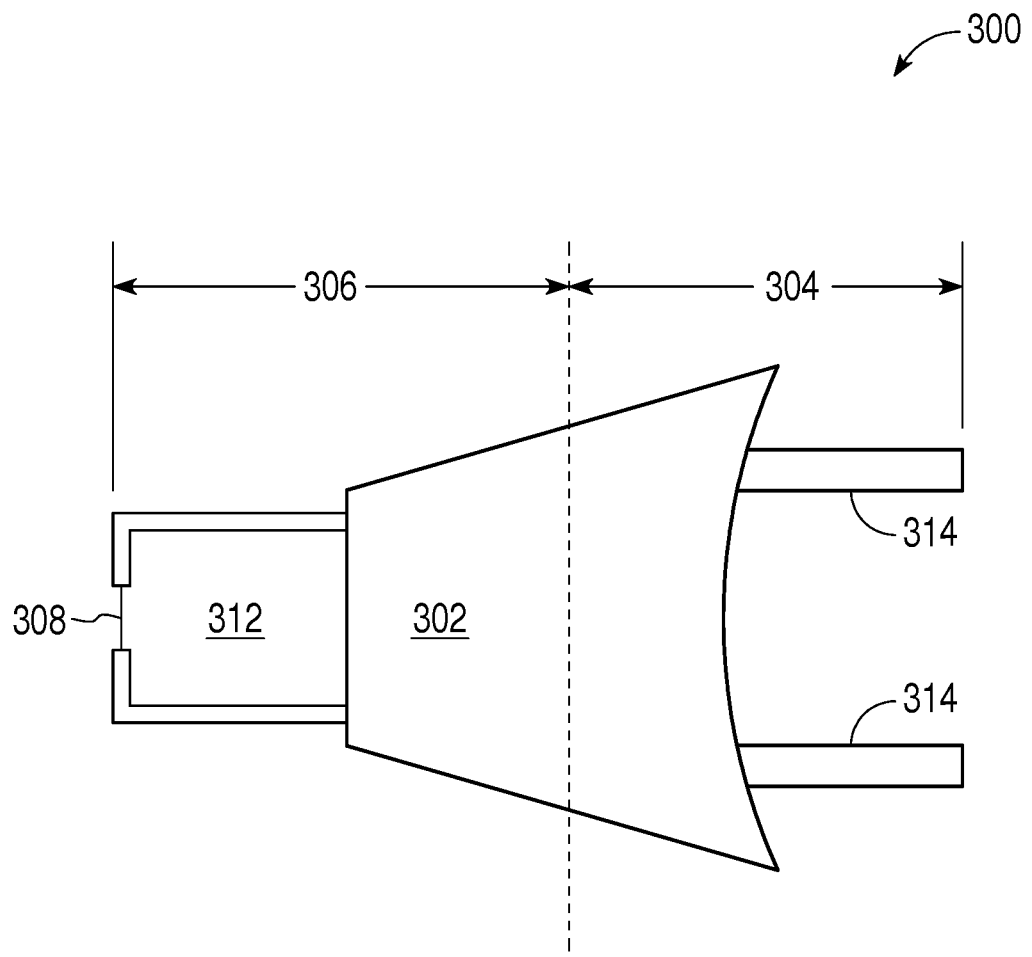
FIG. 3 illustrates an exemplary sensor device that may be used in a sensor assembly, in accordance with embodiments of the present disclosure.

FIG. 3 illustrates a top view of an exemplary sensor device 300, which may be manufactured using manufacturing techniques that would be familiar to one of ordinary skill in the art. The sensor device 300 includes a support structure 302 having a substantially planar shape. The support structure 302 may be formed from an insulating material or semiconductor, such as silicon, silicon having one or more oxide layers formed thereon, or any other suitable material.

In some embodiments, sensor device 300 includes an interface region on one end of the sensor device (interface region 304) and a sensor region on an opposite end of the sensor device (e.g., sensor region 306). The interface region 304 may be suitable for coupling the sensor device 300 to an external device, such as a substrate, e.g., via electrical contact pads on the substrate (as will be described in further detail with respect to FIGS. 4A through 10D). The sensor region 306 may define a cavity 312 across which a freestanding sensing element 308 is suspended.

Also illustrated in FIG. 3 are electrodes 314, which extend from one end of sensor device 300 (e.g., one end of interface region 304) to the opposite end of the sensor device 300 (e.g., opposite end on sensor region 306) and/or to the sensing element 308. The sensing element 308 may be suspended between the two electrodes 314. In one embodiment, sensing element 308 may be a nanowire. The electrodes 314 may be formed from one or more conductive metals. In certain embodiments, the sensing element 308 may be made from the same conductive metal as the electrodes 314. In one embodiment, the sensing element 308 and/or the electrodes 314 may be made of platinum. The electrodes may serve as electrical contacts to which one or more devices may be operatively coupled (e.g., the processing device 230). In some embodiments, a portion of the electrodes 314 may be secured to a substrate, as will be further described in detail with respect to the exemplary sensor assemblies depicted in FIGS. 4A through 10D. The electrodes 314 may serve as electrical contacts for interfacing with such external devices, forming a closed circuit during operation.

Certain embodiments described herein advantageously adapt sensor devices, such as the sensor devices described with respect to FIG. 3 (or any other suitable sensor device), to be inserted directly into a gas flow channel (such as gas flow channel 240 in FIG. 2) while protecting the sensor devices from the corrosive effects of aggressive gases (e.g., halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$, and $SiF_4$, among others, and other gases such as $O_2$ or $N_2O$) that may be utilized in a processing chamber (e.g., processing chamber 101).

For example, embodiments described herein relate to a sensor assembly and materials for a sensor assembly that may be exposed to corrosive chemistries, such as those used during semiconductor processing. The sensor assemblies described herein may be adapted to protect the sensor device from corrosive chemistries while still maintaining the electrical properties, relative shape, and geometric configuration of the sensor device. The sensor assembly may also be adapted to minimize turbulence effects of flow on the sensor device measurements, minimize outgassing or leakage to the external environment, maintain vacuum, retain thermal properties, retain the sensitivity and/or measurement accuracy of the sensor device, and retain the fast response of the sensor device. In certain embodiments, the sensor assemblies/packagings described herein enable use of a fast response sensor device (such as a fast response MEMS based hot wire silicon flow sensor) in corrosive environment. In certain embodiments, the packagings described herein enable to package and hermetically seal the sensor device (such as a fast response MEMS based hot wire silicon flow sensor) and/or sensor assemblies without any leakage (e.g., of vacuum and/or of corrosive gases) to external environment. In certain embodiments, the sensor assemblies/packagings described herein enable to position the sensor device in a way that maximizes its performance avoiding flow turbulence effects. In certain embodiments, the sensor assemblies/packagings described herein enable to position the sensor device in a symmetrical way at the center of the flow path. In certain embodiments, the sensor assemblies/packagings described herein enable to optimize coating thickness to reduce effects on sensitivity of the sensor device. The benefits of such assemblies/packagings include the ability to use a fast response sensor device (such as a fast response MEMS based hot wire silicon flow sensor) in corrosive environment, while doing so in a compact manner (dimension-wise) and in a cost effective manner. This could advantageously provide fast and accurate measurements of the gas flow and temperature virtually anywhere in the tool (such as anywhere in a processing chamber).

FIG. 4A illustrates a perspective view of a sensor assembly 400 in accordance with embodiments of the present disclosure. In one or more embodiments, the sensor assembly (e.g., sensor assembly 400) includes a substrate (e.g., substrate 402). In certain embodiments, the substrate (e.g., substrate 402) includes an outer region (e.g., outer region 402O) for coupling the substrate to a housing (e.g., housing 404), an inner region (e.g., inner region 402I) for coupling the sensor device (e.g., sensor device 300) to the substrate, and a middle region (e.g., middle region 402M) positioned between the outer region and the inner region. The term "outer region," as used herein with respect to substrate 402 or any of the substrates described in any of the other figures, refer to the region of the substrate that is proximate to the external environment that is outside of a gas fluid channel 240. The term "inner region," as used herein with respect to substrate 402 or any of the substrates described in any of the other figures, refer to the region of the substrate that is proximate to the inner environment that is inside gas fluid channel 240. The term "middle region," as used herein with respect to substrate 402 or any of the substrates described in any of the other figures refers to the region of the substrate that is between the outer region and the inner region.

In certain embodiments, the substrate may be made of a dielectric material, such as a sapphire. Sapphire may be a suitable substrate material due to the good corrosion resistance that it provides and the ability to machine it to a suitable shape. In certain embodiments, the dielectric sapphire substrate may be machined to a suitable shape in accordance with methods known to those skilled in the art. In certain embodiments, substrate 402 may have an elongated body with rounded edges (e.g., a cylindrical shape). In certain embodiments, substrate 402 has a cylindrical shape in its outer region 402O and in at least a portion of its middle region 402M which transitions into a semi-cylindrical shape in its inner region 402I.

In certain embodiment, the substrate (e.g., substrate 402) may further include electrical contact pads (e.g., electrical contact pads 414) on at least the inner region of the substrate. In one embodiment, substrate 402 includes electrical contact pads 414 on the flat surface of the semi-cylindrical shape of the inner region 402I. The electrical contacts 314 on the interface region of sensor device 300 may be secured to the electrical contact pads 414 on the inner region of the substrate (e.g., via a metal seal). The electrical contacts 314 on the sensor device along with the electrical contact pads 414 on the substrate and along with one or more external devices (such as processing device 230) form together a closed circuit during operation. The electrical contact pads (e.g., 414) on the substrate may be of the same conductive material as the electrical contacts 314 on the sensor device. For instance, in one embodiment, the electrical contact pads 414 are made of platinum that may be metallized on the flat surface of inner region 402I of substrate 402 via procedures known to the skilled artisan.

In certain embodiments, the substrate (e.g., substrate 402) may be coupled, at its outer region (e.g., 402O) to a housing (e.g., housing 404) to form a hermetic seal. In certain embodiments, the housing may be made of stainless steel, a nickel alloy (e.g., Hastelloy® C-276 alloy, which is an alloy of nickel, molybdenum, and chromium), Kovar (e.g., a nickel-cobalt ferrous alloy), or another suitable material. In one embodiment, the housing may be made of stainless steel. In certain embodiments, the substrate may be secured to the housing via a metal seal, e.g., via soldiering or via brazing, so as to minimize gas leakage from the processing chamber environment to the external environment. In certain embodiments, the substrate may further be secured to the housing via at least one additional leak-proof seal, such as a counterbore C-seal. In certain embodiments, an o-ring may be further disposed between the substrate and the housing to further facilitate the hermetic seal between the substrate and the housing and minimize and/or eliminate vacuum leakage and/or leakage of corrosive gases from gas channel 240 through the sensor assembly 400. In certain embodiments, a cap may be placed between the substrate and the housing in order to engage (e.g., compress) the o-ring.

In the embodiment shown in FIG. 4A, substrate 402 is further machined to define conductor pin holes extending throughout the length of the substrate, from the top of the outer region 402O, through the middle region 402M, and to at least a portion of the inner region 402I. In certain embodiments, the substrate 402 further includes conductor pins 416 inside the conductor pin holes, with the conductor pins 416 extending throughout the outer region 402O and the middle region 402M of the substrate 402 and into at least a portion of the inner region 402I of the substrate 402. In certain embodiments, the conductor pins 416 are secured to the electrical contact pads 414 disposed on the inner region 402I of the substrate 402, via, e.g., a metal seal. The electrical contacts 314 on the sensor device, the electrical contact pads 414 on the substrate, and the conductor pins 416, along with one or more external devices (such as processing device 230) form together a closed circuit during operation. The conductor pins (e.g., 416) extending throughout the substrate may be of the same conductive material as the electrical contacts 314 on the sensor device. For instance, in one embodiment, the conductor pins 416 are made of platinum.

FIG. 4B illustrates a blown up view of region A in FIG. 4A in which the connections between the sensor device 300, the substrate 402, the electrical contact pads 414, and the conductor pins 416 are magnified. In the embodiment shown in FIG. 4B, sensor device 300 is coupled, via its electrical contacts 314, to the electrical contact pads 414 on inner region 402I of substrate 402. In one embodiment, the sensor device is coupled to the electrical contact pads 414 via a first seal 420A, which may be a metal seal, e.g., with a first brazing alloy. In certain embodiments, the sensor device is secured to the substrate such that the support structure (e.g., 302) of the sensor device (e.g., 300) is in perpendicular orientation relative to a gas flow direction (e.g., 242), as will be further illustrated with respect to FIG. 4C. In certain embodiments, the sensor device is secured to the substrate such that the elongated support structure of the sensor device is in parallel orientation relative to a gas flow direction, as will be further illustrated with respect to at least the sensor assembly illustrated in FIG. 6D.

In one embodiment, the outer region 402O of substrate 402 is coupled/secured to the housing 404 via a second seal 420B, which may be a metal seal, e.g., with a second brazing alloy. In certain embodiments, outer region 402O of substrate 402 may also be secured to the housing 404 via at least one additional leak-proof seal, such as counterbore C seal.

In the embodiment shown in FIG. 4B, conductor pins 416 are coupled/secured to the electrical contact pads 414 on inner region 402I of substrate 402. In one embodiment, the conductor pins 416 are secured to the electrical contact pads 414 via a third seal 420C, which may be a metal seal, e.g., with a third brazing alloy. In certain embodiments, the conductor pins 416 may be further secured to the substrate 402, e.g., at the middle region 402M, via a fourth seal 420D, which may be a metal seal, e.g., with a fourth brazing alloy, to form a hermetic seal so as to minimize or eliminate vacuum leakage and/or gases (e.g., corrosive gases) from gas channel 240 through the conductor pin holes in substrate 402 (through which conductor pins 416 pass).

Each of the first seal, second seal, third seal, and fourth seal, if present, may independently include Al alloy, Ag alloy, Au alloy, Ni alloy, Si alloy, Au—Ni alloy, Ni—Pd alloy, Ni—Y alloy, Ti alloy, or a combination thereof. In certain embodiments, the brazing alloy used for all seals is the same. In other embodiments, two or more different brazing alloys may be used for different seals. In one embodiment, at least one of the seals 420A, 420B, 420C, or 420D includes a Sn—Ag—Ti as the brazing alloy. It is to be appreciate that the designation of a "first seal," "second seal,", "third seal," "fourth seal," etc, should not be construed as binding as to the order of binding various components in the sensor assembly described herein and should not be construed as binding as to the total number of seals in a sensor assembly. Rather these designations are merely used for convenience to distinguish one seal from another. Exemplary method(s) for manufacturing various sensor assemblies described herein are described with more detail with respect to FIGS. 11A and 11B below.

In some embodiments, the sensor assembly (e.g., sensor assembly 400) further includes a non-conductive conformal coating on one or more surfaces or on at least a portion of the sensor assembly. In some embodiments, the coating covers some or all of the sensor device (e.g., 300). In some embodiments, the coating covers some or all of the sensor region 306 and/or the interface region 304 of the sensor device 300. In some embodiments, the coating covers some or all of the sensor region 306, including some or all of the sensing element 308. In other embodiments, the conformal coating covers the sensor region 306 without covering the sensing element 308. In some embodiments, the coating covers some or all of the substrate 402. In some embodiments, the coating covers some or all of the outer region 402O, middle region 402M, and/or inner region 402I. In some embodiments, the coating covers some or all of the inner region 402I, including some or all of the electrical contact pads 414. In some embodiments, the coating covers some or all of the middle region 402M, including some or all of the conductor pins 416. In some embodiments, the coating covers some or all of the various seals (e.g., first seal 420A, second seal 420B, third seal 420C, and/or fourth seal 420D). In certain embodiments, the sensor assembly may remain fully uncoated.

In some embodiments, the sensor assembly is first assembled so as to form electrical contacts between all of the components of the sensor assembly (e.g., between the sensor device and the substrate as well as between the substrate and the conductor pins), and thereafter the assembled sensor assembly is coated such that the coating covers portions of the sensor assembly that are exposed to a gas flow when the sensor assembly is coupled into a gas flow channel, as discussed below with respect to FIG. 4C.

In some embodiments, the coating is deposited using, for example, a technique such as ALD, IAD, low pressure plasma spray (LPPS), chemical vapor deposition (CVD), plasma spray chemical vapor deposition (PS-CVD), sputtering, combinations thereof, or other techniques or modifications thereof suitable for forming conformal coatings. In some embodiments, the coating comprises a ceramic material that is resistant to corrosion by process gases or reactive species. For example, in some embodiments, the coating may comprise a plasma-resistant ceramic coating comprising a rare-earth ceramic selected from $Y_2O_3$, YZrO, $Y_xZr_yO_z$, YZrOF, $Y_3Al_5O_{12}$, $Y_4Al_2O_9$, $YF_3$, $Y_xO_yF_z$, YOF, $Er_2O_3$, $Er_3Al_5O_{12}$, $ErF_3$, $E_xO_yF_z$, ErOF, $La_2O_3$, $Lu_2O_3$, $Sc_2O_3$, $ScF_3$, ScOF, $Gd_2O_3$, $Sm_2O_3$, $Dy_2O_3$, a $Y_2O_3$—$ZrO_2$ solid solution, a ceramic comprising $Y_2Al_4O_9$ and a $Y_2O_3$—$ZrO_2$ solid solution, or combinations thereof. In some embodiments, the coating comprises $Al_2O_3$. In one embodiment, the coating comprises $Al_2O_3$ deposited by atomic layer deposition (ALD). In some embodiments, the coating is substantially uniform in thickness, conformal to the underlying surface that is being coated, porosity-free, has no cracks, acts as a diffusion barrier for metal contaminants, and has high purity (e.g., greater than about 99% purity, or greater than about 99.95% purity). In certain embodiments, ALD may be advantageously used to coat all dimensions of the sensor assembly. In some embodiments, the coating is resistant cracking and/or delamination at various temperatures (such as up to 350° C.).

In certain embodiments, the coating may have a uniform thickness with a thickness variation of less than about +/−20%, a thickness variation of less than about +/−10%, a thickness variation of less than about +/−5%, or a lower thickness variation when comparing the thickness of the coating in one location to the thickness of the coating in another location (or when comparing the thickness of the coating in one location as compared to the average thickness of the coating, or when assessing the standard deviation of the thickness of the coating across several locations).

In certain embodiments, the coating may be conformal to the underlying surface that is being coated, including underlying surface features and/or complex geometrical shapes and/or portions coated which have high aspect ratios. For instance, the coating may conformally and uniformally coat portion that have high aspect ratios, e.g., length:width (L:W) or length:diameter (L:D), ranging from about 2:1 to about 500:1, from about 5:1 to about 300:1, from about 10:1 to about 150:1, from about 15:1 to about 100:1, or from about 20:1 to about 50:1.

In certain embodiments, the coating may be very dense and have a very low porosity, such as, a porosity of less than about 1%, less than about 0.5%, less than about 0.1%, or porosity-free (porosity of 0%). In certain embodiments, the coating may have a crack free microstructure, hermetic, and have a high dielectric breakdown resistance.

In certain embodiments, the coating may be deposited at a low deposition temperature, e.g., a deposition temperature up to 350° C., which may allow its use with a wide variety of materials.

FIG. 4D illustrates a cross-sectional view of a conformal coating formed on surfaces of an exemplary sensor assembly, in accordance with embodiments of the present disclosure. For the sake of simplicity, FIG. 4D illustrates coating 420 on a portion of sensor assembly 400, which could be any portion of sensor assembly 400 described herein. In a similar manner, coating 420 may be deposited on any portion of any of the other sensor assemblies described herein. In some embodiments, the coating includes multiple layers 422A-422D that are deposited in succession. In some embodiments, more or fewer layers than shown may be present, and the number of layers may range from 1 layer to 100 layers, up to 500 layers, or more. For example, multiple atomically-thin or near atomically-thin layers may be deposited, for example, using ALD. In some embodiments, the compositions of each of the layers 422A-422D may alternate. In some embodiments, a total thickness of the coating may range from 10 nanometers to 500 nanometers, any sub-range therein or any single value therein In certain embodiments, the thickness of the coating is optimized so as to reduce effects of the coating on the sensitivity of the measurements while also protecting the sensor assembly (and various components of the sensor assembly) from the aggressive chemistries to which the sensor assembly may be exposed to during processing.

FIG. 4C illustrates a cross-sectional side view of an exemplary flow channel (such as flow channel 240) with the sensor assembly 400 of FIG. 4A coupled thereto in accordance with embodiments of the present disclosure. As shown in this figure, sensor assembly 400 may be mounted on a manifold, such as K1S T manifold (with tee fitting 492), via a suitable seal, such as a leak-proof seal (e.g., a C-seal). The manifold may be coupled, on opposing ends, to a gas flow channel 240 (such as a tubing).

In certain embodiments, the housing (e.g., housing 404) may include a gas-facing surface 460 and an opposing surface 470 opposite the gas-facing surface. The housing 404 may have at least one slot (e.g., slot 480B) formed therethrough and shaped to receive the substrate (e.g., substrate 402). The substrate 402 may be inserted into the slot (e.g., slot 480B) such that the inner region of the substrate 402I extends from the gas-facing surface 460, e.g., into the internal environment of the gas flow channel (e.g., gas flow channel 240). In certain embodiments, the housing 404 may include at least one additional slot (e.g., 480A and 480C), which may be configured to mount the housing 404 to the gas flow channel 240, e.g., via a suitable manifold and/or suitable seals (such as a C seal 490) and/or via suitable fittings (such as tee fitting 492). Seal 490 may be an air-tight seal to prevent gas leakage from gas flow channel 240 to the external environment. In some embodiments, the seal 490 is a metal seal formed, for example, by brazing or soldering.

Figure 5A:
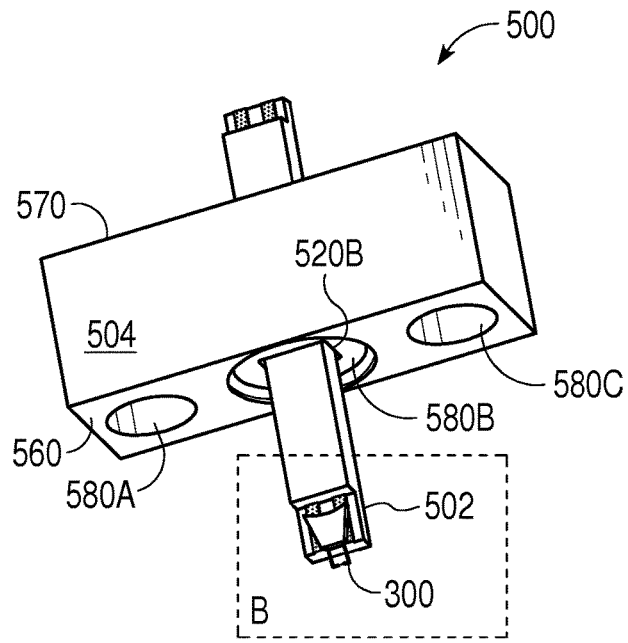
FIG. 5A illustrates a perspective view of a sensor assembly, in accordance with embodiments of the present disclosure.

FIG. 5A illustrates a perspective view of a sensor assembly 500 in accordance with embodiments of the present disclosure. In one or more embodiments, the sensor assembly (e.g., sensor assembly 500) includes a substrate (e.g., substrate 502). In certain embodiments, the substrate (e.g., substrate 502) includes an outer region (e.g., outer region 502O) for coupling the substrate to a housing (e.g., housing 504), an inner region (e.g., inner region 502I) for coupling the sensor device (e.g., sensor device 300) to the substrate, and a middle region (e.g., middle region 502M) positioned between the outer region and the inner region. In certain embodiments, the dielectric substrate may be a multi-layered ceramic made of a plurality of layers of ceramic sheets. The multi-layered ceramic substrate may be made of any dielectric ceramic material that can be formed into a suitable shape. In certain embodiments, the dielectric multi-layered ceramic substrate may be made of alumina ($Al_2O_3$) or of aluminum nitride (AlN). In certain embodiments, the substrate may be made of AlN, Si, SiC, $Al_2O_3$, $SiO_2$, and the like. The multi-layered ceramic substrate may be advantageously used due its high strength, good insulation, small thermal expansion coefficient, and good chemical stability. The multi-layered ceramic may be made by methods known to those skilled in the art, such as through a process including, but not limited to, one or more of the following operations: tape casting, tape cutting, framing, via punching, via filling, screen printing, laminating, cutting, co-firing, Ni plating, Au plating, or a combination thereof.

Figure 5B:
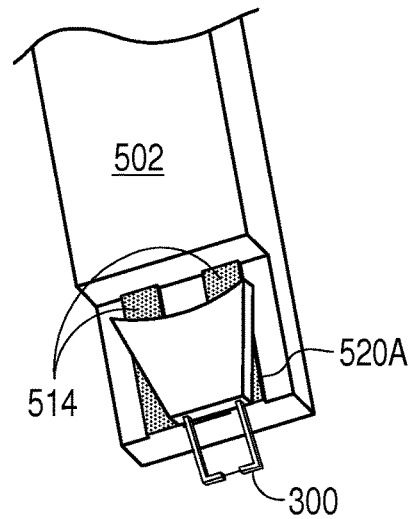
FIG. 5B illustrates a blown up view of region B in FIG. 5A.
Figure 5C:
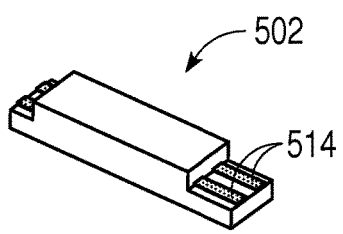
FIG. 5C illustrates a perspective view of a multi-layered ceramic substrate included in the sensor assembly of FIG. 5A, in accordance with embodiments of the present disclosure.
Figure 5D:
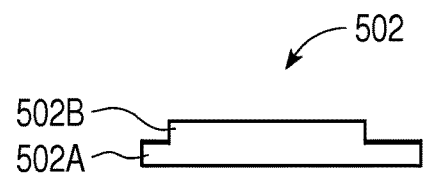
FIG. 5D illustrates a side view of the multi-layered ceramic substrate of FIG. 5C.
Figure 5E:
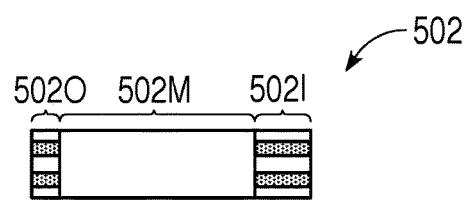
FIG. 5E illustrates a top view of the multi-layered ceramic substrate of FIG. 5C.

FIG. 5C illustrates a perspective view of a multi-layered ceramic substrate included in the sensor assembly of FIG. 5A, in accordance with embodiments of the present disclosure. FIG. 5D illustrates a side view of the multi-layered ceramic substrate of FIG. 5C. FIG. 5E illustrates a top view of the multi-layered ceramic substrate of FIG. 5C. In the embodiment shown in FIGS. 5C-5E, two layers of ceramic sheets are shown (e.g., first layer 502A and second layer 502B covering a portion of first layer 502A). In the depicted embodiments, ceramic layers 502A and 502B are in contact such that hermetic sealing is achieved between the layers. In the shown embodiment, electrical contact pads 514 are formed/built-in between layers of the multi-layered ceramic substrate 502 (e.g., electrical contact pads 514 are formed between first ceramic layer 502A and second ceramic layer 502B). The electrical contact pads 514 extend throughout the multi-layered ceramic substrate from its outer region 502O to its inner region 502I. One advantage of this substrate is that hermetic sealing is achieved between the ceramic layers of the multi-layered ceramic, along with the electrical contact pads that are formed between the layers. This hermetic sealing reduces the number of location in which various components of the sensor assembly are secured via a metal seal (e.g., via brazing) and minimizes potential locations for leakage of vacuum and/or gases from the inner environment in gas channel 240.

While substrate 502 is exemplified in FIGS. 5C-5E as having sharp corners (e.g., a rectangular shape for each of the layers), the instant disclosure also contemplates a multi-layered ceramic substrate having a rounded shape with rounded edges, similar to the shape illustrated for substrate 402 in sensor assembly 400. In certain embodiments, other substrate shapes may also be used and the disclosure should not be construed as limited to the shapes illustrated in the figures.

In certain embodiment, the electrical contacts 314 on the interface region of sensor device 300 may be secured to the electrical contact pads 514 on the inner region 502I of the substrate 502 (e.g., via a metal seal). The electrical contacts 314 on the sensor device along with the electrical contact pads 514 on the substrate and along with one or more external devices (such as processing device 230) form together a closed circuit during operation. The electrical contact pads (e.g., 514) located between layers of the multi-layered ceramic substrate 502 may be of the same conductive material as the electrical contacts 314 on the sensor device. For instance, in one embodiment, the electrical contact pads 514 are made of platinum.

In certain embodiments, the substrate (e.g., substrate 502) may be coupled, at its outer region (e.g., 502O) to a housing (e.g., housing 504). In certain embodiments, the housing may be made of stainless steel, a nickel alloy (e.g., Hastelloy® C-276 alloy, which is an alloy of nickel, molybdenum, and chromium), Kovar (e.g., a nickel-cobalt ferrous alloy), or another suitable material. In one embodiment, the housing may be made of stainless steel. In certain embodiments, the substrate may be secured to the housing via a metal seal, e.g., via soldiering or via brazing, so as to minimize gas leakage from the processing chamber environment to the external environment. In certain embodiments, the substrate may further be secured to the housing via at least one additional leak-proof seal, such as a counterbore C-seal.

In certain embodiments, an o-ring 580 may be further disposed between the substrate 502 and the housing 504 to further facilitate the hermetic seal between the substrate and the housing and minimize and/or eliminate vacuum leakage and/or leakage of corrosive gases from gas channel 240 through the sensor assembly 500. In certain embodiments, a cap may be placed between the substrate and the housing in order to engage (e.g., compress) the o-ring.

FIG. 5B illustrates a blown up view of region B in FIG. 5A in which the connections between the sensor device 300, the substrate 502, and electrical contact pads 514 are magnified. In the embodiment shown in FIG. 5B, sensor device 300 is coupled, via its electrical contacts 314, to the electrical contact pads 514 on inner region 502I of substrate 502. In one embodiment, the sensor device is coupled to the electrical contact pads 514 via a first seal 520A, which may be a metal seal formed through soldiering or brazing, e.g., with a first brazing alloy. In certain embodiments, the sensor device is secured to the substrate such that the support structure (e.g., 302) of the sensor device (e.g., 300) is in perpendicular orientation relative to a gas flow direction (e.g., 242), as will be further illustrated with respect to FIG. 5F. In certain embodiments, the sensor device is secured to the substrate such that the support structure of the sensor device is in parallel orientation relative to a gas flow direction, as will be further illustrated with respect to at least the sensor assembly illustrated in FIG. 6D.

In one embodiment, outer region 502O of substrate 502 is coupled/secured to the housing 504 via a second seal 520B, which may be a metal seal, e.g., with a second brazing alloy. In certain embodiments, outer region 502O of substrate 502 may also be secured to the housing 504 via at least one additional leak-proof seal, such as counterbore C seal. In certain embodiments, the substrate is secured to the housing via a hermetic seal to minimize and/or eliminate leakage of vacuum and/or gases from gas channel 240.

Each of the first seal (520A) and second seal (520B), if present, may independently include Al alloy, Ag alloy, Au alloy, Ni alloy, Si alloy, Au—Ni alloy, Ni—Pd alloy, Ni—Y alloy, Ti alloy, or a combination thereof. In certain embodiments, the brazing alloy used for all seals is the same. In other embodiments, two or more different brazing alloys may be used for different seals. In one embodiment, at least one of the seals 520A, or 520B, includes a Ag—Cu as the brazing alloy. It is to be appreciate that the designation of a "first seal," "second seal," etc, should not be construed as binding as to the order of binding various components in the sensor assembly described herein and should not be construed as binding as to the total number of seals in a sensor assembly. Rather these designations are merely used for convenience to distinguish one seal from another. Exemplary method(s) for manufacturing various sensor assemblies described herein are described with more detail with respect to FIGS. 11A and 11B below.

In some embodiments, the sensor assembly (e.g., sensor assembly 500) further includes a non-conductive conformal coating one or more surfaces or on at least a portion of the sensor assembly. In some embodiments, the coating covers some or all of the sensor device (e.g., 300). In some embodiments, the coating covers some or all of the sensor region 306 and/or the interface region 304 of the sensor device 300. In some embodiments, the coating covers some or all of the sensor region 306, including some or all of the sensing element 308. In other embodiments, the conformal coating covers the sensor region 306 without covering the sensing element 308. In some embodiments, the coating covers some or all of the substrate 502. In some embodiments, the coating covers some or all of the outer region 502O, middle region 502M, and/or inner region 502I. In some embodiments, the coating covers some or all of the inner region 502I, including some or all of the electrical contact pads 514. In some embodiments, the coating covers some or all of the middle region 502M. In some embodiments, the coating covers some or all of the various seals (e.g., first seal 520A and/or second seal 520B). In some embodiments, the sensor assembly 500 is first assembled so as to form electrical contacts between all of the components of the sensor assembly (e.g., between the sensor device and the substrate), and thereafter the assembled sensor assembly is coated such that the coating covers portions of the sensor assembly that are exposed to a gas flow when the sensor assembly is coupled into a gas flow channel, as discussed below with respect to FIG. 5F. In some embodiments, the coating deposited on at least a portion of sensor assembly 500 may be similar to the coating described hereinabove as suitable for coating at least a portion of sensor assembly 400 (e.g., similar in the deposition technique, the coating composition/material, and/or the coating's uniformity, conformality, porosity, architecture, and the like). In certain embodiments, sensor assembly 500 remains fully uncoated.

Figure 5F:
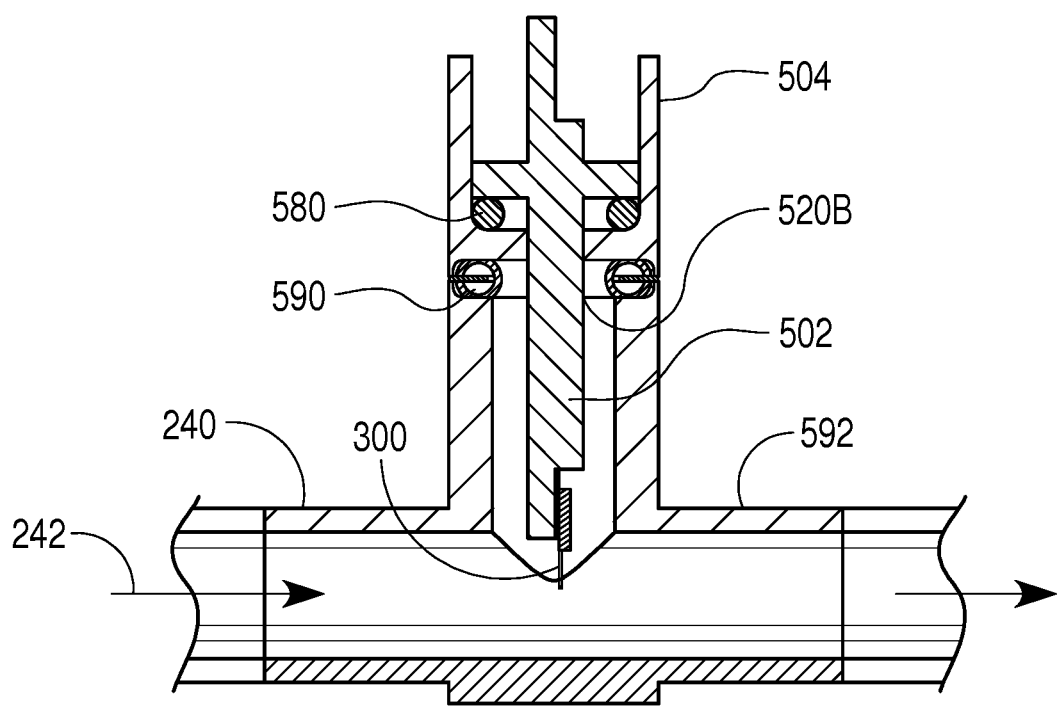
FIG. 5F illustrates a cross-sectional side view of an exemplary flow channel with the sensor assembly of FIG. 5A mounted thereto, in accordance with embodiments of the present disclosure.

FIG. 5F illustrates a cross-sectional side view of an exemplary flow channel (such as flow channel 240) with the sensor assembly 500 of FIG. 5A coupled thereto in accordance with embodiments of the present disclosure. As shown in this figure, sensor assembly 500 may be mounted on a manifold, such as K1S T manifold (with tee fitting 592), via a suitable seal, such as a leak-proof seal (e.g., a C-seal). The manifold may be coupled, on opposing ends, to a gas flow channel 240 (such as a tubing).

In certain embodiments, the housing (e.g., housing 504) may include a gas-facing surface 560 and an opposing surface 570 opposite the gas-facing surface. The housing 504 may have at least one slot (e.g., slot 580B) formed therethrough and shaped to receive the substrate (e.g., substrate 502). The substrate 502 may be inserted into the slot (e.g., slot 580B) such that the inner region of the substrate 502I extends from the gas-facing surface 560, e.g., into the internal environment of the gas flow channel (e.g., gas flow channel 240). In certain embodiments, the housing 504 may include at least one additional slot (e.g., 580A and 580C), which may be configured to mount the housing 504 to the gas flow channel 240, e.g., via a suitable manifold and/or via suitable seals (such as a C seal 590) and/or via suitable fittings (such as Tee fitting 592). Seal 590 may be an air-tight seal to prevent gas leakage from gas flow channel 240 to the external environment. In some embodiments, the seal 590 is a metal seal formed, for example, by brazing or soldering.

Although sensor assembly 400 and sensor assembly 500 illustrated embodiments in which the sensor device 300 is secured to the corresponding substrate such that the support structure of the sensor device is in perpendicular orientation relative to the gas flow direction (e.g., 242), in some embodiments, the sensor device 300 could be secured to the substrate such that the support structure of the sensor device is in parallel orientation relative to the gas flow direction (e.g., 242). Such exemplary embodiment will be described with respect to at least sensor assembly 600 in FIG. 6D.

FIG. 6A illustrates a perspective view of a sensor assembly 600 in accordance with embodiments of the present disclosure. In one or more embodiments, the sensor assembly (e.g., sensor assembly 600) includes a substrate (e.g., substrate 602). In certain embodiments, the substrate (e.g., substrate 602) includes an outer region (e.g., outer region 602O) for coupling the substrate to a housing (e.g., housing 604), an inner region (e.g., inner region 602I) for coupling the sensor device (e.g., sensor device 300) to the substrate, and a middle region (e.g., middle region 602M) positioned between the outer region and the inner region.

FIG. 6C illustrates a perspective view of a substrate such as the one included in the sensor assembly 600 of FIG. 6A, in accordance with embodiments of the present disclosure. In the embodiment depicted in FIG. 6C, the substrate is made of a dielectric material, such as a sapphire. In the embodiment depicted in FIG. 6C, the substrate is a machined sapphire having rounded edges. Illustrated substrate 602 has a cylindrical shape in its middle region 602M. In the illustrated embodiment, the cylindrical shape of region 602M transitions into a semi-cylindrical shape in the inner region 602I. In the illustrated embodiment, the cylindrical shape of region 602M continues into a portion of outer region 602O until it reaches the top of outer region 602O. In the illustrated embodiment, the top of outer region 602O is shaped as a disk with a larger diameter than the diameter of the cylindrical portion in region 602O and 602M. The illustrated substrate further defines conductor pin holes 616H that extend from the top of the outer region 602O of substrate 602 to the bottom of the inner region 602I of substrate 602 and are shaped to receive conductor pins 616, as will be described in further detail below. In certain embodiments, a substrate with rounded edges (whether a sapphire or a multi-layered ceramic) may ease out stressors, which may extend the operating life of the sensor assembly. Substrate 602 may be machined into the illustrated shape or into any other suitable shape by means known to those skilled in the art.

In certain embodiment, the substrate (e.g., substrate 602) may further include electrical contact pads (e.g., electrical contact pads 614) on at least the inner region of the substrate. The electrical contacts 314 on the interface region of sensor device 300 may be secured to the electrical contact pads 614 on the inner region of the substrate (e.g., via a metal seal). The electrical contacts 314 on the sensor device along with the electrical contact pads 614 on the substrate and along with one or more external devices (such as processing device 230) form together a closed circuit during operation. The electrical contact pads (e.g., 614) on the substrate may be of the same conductive material as the electrical contacts 314 on the sensor device. For instance, in one embodiment, the electrical contact pads 614 are platinum that may be metallized on the substrate (e.g., machined sapphire substrate 602) via procedures known to the skilled artisan.

In certain embodiments, the substrate (e.g., substrate 602) may be coupled, at its outer region (e.g., 602O) to a housing (e.g., housing 604). In certain embodiments, the housing may be made of stainless steel, a nickel alloy (e.g., Hastelloy® C-276 alloy, which is an alloy of nickel, molybdenum, and chromium), Kovar (e.g., a nickel-cobalt ferrous alloy), or another suitable material. In one embodiment, the housing may be made of stainless steel. In certain embodiments, the substrate may be secured to the housing via a metal seal, e.g., via soldiering or via brazing, so as to minimize gas leakage from the processing chamber environment to the external environment.

In certain embodiments, an o-ring may be further disposed between the substrate 602 and the housing 604 to further facilitate the hermetic seal between the substrate and the housing and minimize and/or eliminate vacuum leakage and/or leakage of corrosive gases from gas channel 240 through the sensor assembly 600. In certain embodiments, a cap may be placed between the substrate and the housing in order to engage (e.g., compress) the o-ring.

In the embodiment shown in FIG. 6A, the substrate 602 further includes conductor pins 616 extending throughout the outer region 602O and the middle region 602M of the substrate 602 all the way to the bottom of the inner region 602I of the substrate 602. The conductor pins 616 are received in the substrate 602 through conductor pin holes 616H that extend from the top of the outer region 602O of substrate 602 to the bottom of the inner region 602I of substrate 602. In certain embodiments, the conductor pins 616 are secured to the electrical contact pads 614 disposed at the bottom of the inner region 602I of the substrate 602. The electrical contacts 314 on the sensor device, the electrical contact pads 614 on the substrate, and the conductor pins 616, along with one or more external devices (such as processing device 230) form together a closed circuit during operation. The conductor pins (e.g., 616) extending throughout the substrate may be made of the same conductive material as the electrical contacts 314 on the sensor device. For instance, in one embodiment, the conductor pins 616 are made of platinum.

Figure 6D:
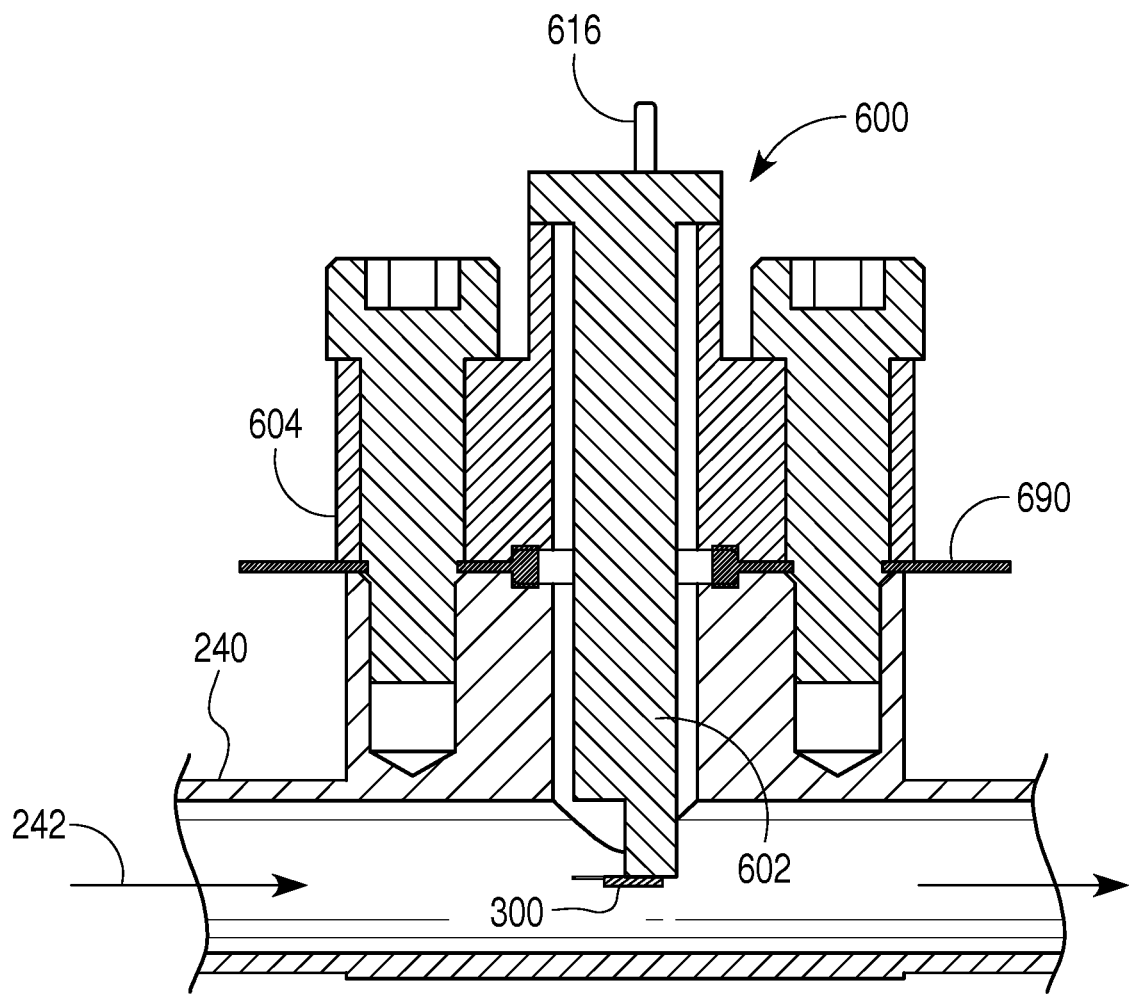
FIG. 6D illustrates a cross-sectional side view of an exemplary flow channel with the sensor assembly of FIG. 6A in accordance with embodiments of the present disclosure.

FIG. 6B illustrates a blown up view of region C in FIG. 6A in which the connections between the sensor device 300 and the substrate 602 are magnified. In the embodiment shown in FIG. 6B, sensor device 300 is coupled, via its electrical contacts 314, to the electrical contact pads 614 on inner region 602I of substrate 602. In one embodiment, the sensor device is coupled to the electrical contact pads 614 via a first seal 620A, which may be a metal seal, e.g., with a first brazing alloy. In certain embodiments, the sensor device is secured to the substrate such that the support structure (e.g., 302) of the sensor device (e.g., 300) is in parallel orientation relative to a gas flow direction (e.g., 242), as will be further illustrated with respect to FIG. 6D. One of the main differences between sensor assembly 600 and sensor assembly 400 is the orientation of the sensor device 300. In certain embodiments, measurement attained from sensor assemblies with a sensor device secured in parallel orientation may be less affected by recirculation and/or turbulence of the gas flow and may improve conductance through the flow path. In certain embodiments, a sensor device (such as sensor device 300) secured to a substrate in a parallel orientation (relative to the gas flow direction, e.g., 242), results in recirculation of the gas further away from the sensor tip, which has a minimal impact on the accuracy of the sensor measurements.

In one embodiment, the outer region 602O of substrate 602 is coupled/secured to the housing 604 via a second seal 620B, which may be a metal seal, e.g., with a second brazing alloy and/or via a third seal 620C, which may also be a metal seal, e.g., with a third brazing alloy. In certain embodiments, the outer region 602O of substrate 602 may be further secured to the housing 604 via at least one additional seal, such as a leak-proof seal (e.g., counterbore C seal).

In the embodiment shown in FIG. 6B, conductor pins 616 may coupled/secured to the electrical contact pads 614 and/or to the sensor device 300 at the bottom of inner region 602I of substrate 602 via a fourth seal 620D, which may be a metal seal, e.g., with a fourth brazing alloy. In certain embodiments, the conductor pins 616 may be also secured to the substrate 602, e.g., at the bottom of inner region 602I, via a fifth seal 620E, which may be a metal seal, e.g., with a fifth brazing alloy. In certain embodiments, the conductor pins 616 may be secured to the substrate 602 via a seal so as to minimize and/or eliminate vacuum leakage and/or leakage of corrosive gases from gas channel 240 through the sensor assembly 600 (e.g., through conductor pin holes 616H through which conductor pins 616 pass).

Each of the first seal (620A), second seal (620B), third seal (620C), fourth seal (620D), and fifth seal (620E), if present, may independently include Al alloy, Ag alloy, Au alloy, Ni alloy, Si alloy, Au—Ni alloy, Ni—Pd alloy, Ni—Y alloy, Ti alloy, or a combination thereof. In certain embodiments, the brazing alloy used for all seals is the same. In other embodiments, two or more different brazing alloys may be used for different seals. In one embodiment, at least one of the seals 620A, 620B, 620C, 620D, or 620E includes a Sn—Ag—Ti as the brazing alloy. It is to be appreciate that the designation of a "first seal," "second seal," "third seal," "fourth seal," "fifth seal," etc, should not be construed as binding as to the order of binding various components in the sensor assembly described herein and should not be construed as binding as to the total number of seals in a sensor assembly. Rather these designations are merely used for convenience to distinguish one seal from another. Exemplary method(s) for manufacturing various sensor assemblies described herein are described with more detail with respect to FIGS. 11A and 11B below.

In some embodiments, the sensor assembly (e.g., sensor assembly 600) further includes a non-conductive conformal coating one or more surfaces or on at least a portion of the sensor assembly. In some embodiments, the coating covers some or all of the sensor device (e.g., 300). In some embodiments, the coating covers some or all of the sensor region 306 and/or the interface region 304 of the sensor device 300. In some embodiments, the coating covers some or all of the sensor region 306, including some or all of the sensing element 308. In other embodiments, the conformal coating covers the sensor region 306 without covering the sensing element 308. In some embodiments, the coating covers some or all of the substrate 602. In some embodiments, the coating covers some or all of the outer region 602O, middle region 602M, and/or inner region 602I. In some embodiments, the coating covers some or all of the inner region 602I, including some or all of the electrical contact pads 614 and/or conductor pins 616. In some embodiments, the coating covers some or all of the middle region 602M. In some embodiments, the coating covers some or all of the various seals (e.g., first seal 620A, second seal 620B, third seal 620C, fourth seal 620D, and/or fifth seal 620E). In some embodiments, the sensor assembly is first assembled so as to form electrical contacts between all of the components of the sensor assembly (e.g., between the sensor device, the conductor pins, and the substrate), and thereafter the assembled sensor assembly is coated such that the coating covers at least portions of the sensor assembly that are exposed to a gas flow when the sensor assembly is coupled into a gas flow channel, as discussed below with respect to FIG. 6D. In certain embodiments, if the coating covers the conductor pins 616 at the top portion of the outer region 602O of the substrate 602 (e.g., the top portion being that which is exposed to the external environment and extends from the opposing surface of the housing 670 that is opposite to the gas-facing surface 660), a portion of the coating may be uncovered (e.g., etched) to expose at least part of the conductor pins 616. The exposed part of the conductor pins 616 (in the external environment) can then be coupled to one or more external devices (such as processing device 230) to form a closed electrical circuit during operation. In certain embodiments, sensor assembly 600 remains fully uncoated.

In some embodiments, the coating deposited on at least a portion of sensor assembly 600 may be similar to the coating described hereinabove as suitable for coating at least a portion of sensor assembly 400 (e.g., similar in the deposition technique, the coating composition/material, and/or the coating's uniformity, conformality, porosity, architecture, and the like).

FIG. 6D illustrates a cross-sectional side view of an exemplary flow channel (such as flow channel 240) with the sensor assembly 600 of FIG. 6A coupled thereto in accordance with embodiments of the present disclosure.

In certain embodiments, the housing (e.g., housing 604) may include a gas-facing surface 660 and an opposing surface 670 opposite the gas-facing surface. The housing 604 may have at least one slot (e.g., slot 680B) formed therethrough and shaped to receive the substrate (e.g., substrate 602). The substrate 602 may be inserted into the slot (e.g., slot 680B) such that the inner region of the substrate 602I extends from the gas-facing surface 660, e.g., into the internal environment of the gas flow channel (e.g., gas flow channel 240). In certain embodiments, the housing 604 may include at least one additional slot (e.g., 680A and 680C), which may be configured to mount the housing 604 to the gas flow channel 240, e.g., via a suitable manifold (such as a K1H manifold) and/or via suitable seals (such as a C seal 690) and/or via suitable fittings. Seal 690 may be an air-tight seal to prevent gas leakage from gas flow channel 240. In some embodiments, the seal 690 is a metal seal formed, for example, by brazing or soldering.

In certain embodiments, the dimensions of sensor assembly 600 are greater than the dimensions of sensor assemblies 400 and 500, since the substrate 602 is inserted into slot 680B with the sensor device 300 secured to the substrate 602 in a parallel orientation relative to the direction of the gas flow 242 (as opposed to being in a perpendicular orientation as shown with sensor assemblies 400 and 500). In certain embodiments, slot 680B may be shaped to accommodate insertion of substrate 602 with sensor device 300 coupled thereto in a parallel orientation and without the sensing element 308 touching the perimeter of slot 680B.

Figure 7A:
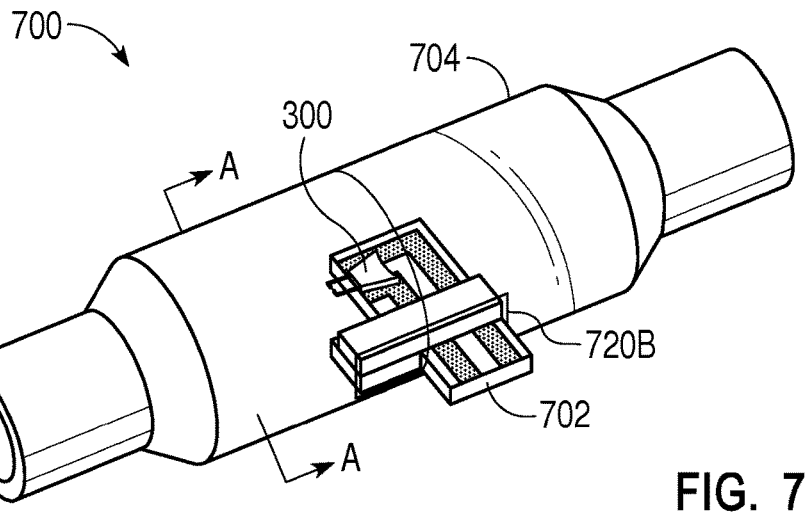
FIG. 7A illustrates a perspective view of a sensor assembly in accordance with embodiments of the present disclosure.

FIG. 7A illustrates a perspective view of a sensor assembly 700 in accordance with certain other embodiments of the present disclosure. In one or more embodiments, the sensor assembly (e.g., sensor assembly 700) includes a substrate (e.g., substrate 702). In certain embodiments, the substrate (e.g., substrate 702) includes an outer region (e.g., outer region 702O), an inner region (e.g., inner region 702I) for coupling the sensor device (e.g., sensor device 300) to the substrate, and a middle region (e.g., middle region 702M) positioned between the outer region and the inner region. In certain embodiments, the substrate may be coupled to a housing (e.g., housing 704) at the middle region 702M. In certain embodiments, the substrate 702 may be a multi-layered ceramic made of a plurality of layers of ceramic sheets, similar to the multi-layered ceramic substrate 502 described with respect to sensor assembly 500.

Figure 7B:
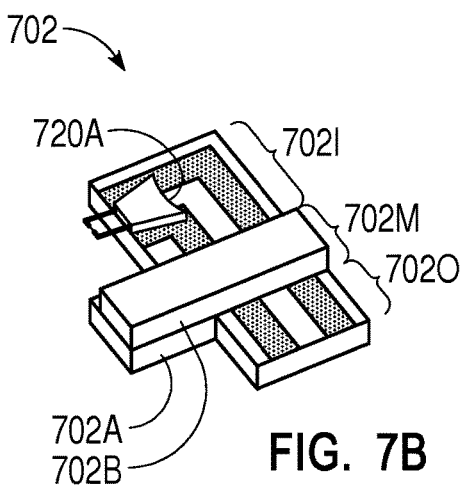
FIG. 7B illustrates a perspective view of a multi-layered ceramic substrate included in the sensor assembly of FIG. 7A with a sensor device coupled thereto at the inner region, in accordance with embodiments of the present disclosure.
Figure 7C:
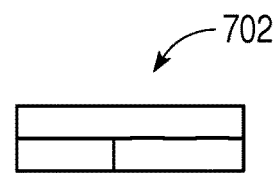
FIG. 7C illustrates a side view of the multi-layered ceramic substrate of FIG. 7B.
Figure 7D:
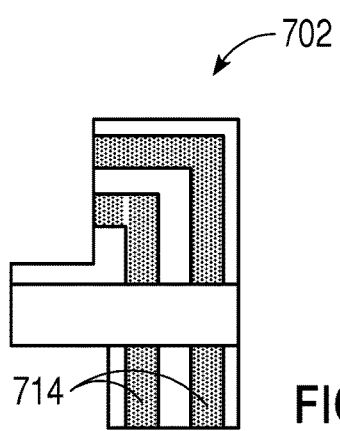
FIG. 7D illustrates a top view of the multi-layered ceramic substrate of FIG. 7B.

FIG. 7B illustrates a perspective view of a multi-layered ceramic substrate included in the sensor assembly of FIG. 7A, with a sensor device 300 coupled to the substrate 702 at the inner region 702I, in accordance with embodiments of the present disclosure. FIG. 7C illustrates a side view of the multi-layered ceramic substrate of FIG. 7B. FIG. 7D illustrates a top view of the multi-layered ceramic substrate of FIG. 7B. In the embodiment shown in FIGS. 7B-7D, two layers of ceramic sheets are shown (e.g., first layer 702A and second layer 702B covering a portion of first layer 702A, at the middle region 702M). In the depicted embodiments, ceramic layers 702A and 702B are in contact such that hermetic sealing is achieved between the layers (similar to multi-layered ceramic substrate 502). In the shown embodiment, electrical contact pads 714 are formed/built-in between layers of the multi-layered ceramic substrate 702 (e.g., electrical contact pads 714 are formed between first ceramic layer 702A and second ceramic layer 702B). The electrical contact pads 714 extend throughout the multi-layered ceramic substrate from its outer region 702O to its inner region 702I. This substrate, like substrate 502, has the advantage that hermetic sealing is achieved between the ceramic layers of the multi-layered ceramic substrate, along with the electrical contact pads that are formed between the layers. This hermetic sealing reduces the number of location in which various components of the sensor assembly are secured via a metal seal (e.g., via brazing).

The ceramic substrate 702 may be made of any suitable plasma-resistant ceramic, which may be shaped into a suitable multi-layered ceramic in accordance with methods known to those skilled in the art, as explained hereinabove with respect to substrate 502. Similarly, ceramic substrate 702 may be made of similar materials as those described hereinabove for substrate 502.

In certain embodiment, the electrical contacts 314 on the interface region of sensor device 300 may be secured to the electrical contact pads 714 on the inner region of the substrate 702 (e.g., via a metal seal). The electrical contacts 314 on the sensor device along with the electrical contact pads 714 on the substrate and along with one or more external devices (such as processing device 230) form together a closed circuit during operation. The electrical contact pads (e.g., 714) located between layers of the multi-layered ceramic substrate 702 may be of the same conductive material as the electrical contacts 314 on the sensor device. For instance, in one embodiment, the electrical contact pads 714 are made of platinum.

In certain embodiments, the substrate (e.g., substrate 702) may be coupled, at its middle region (e.g., 702M) to a housing (e.g., housing 704). In certain embodiments, the housing may be made of stainless steel, a nickel alloy (e.g., Hastelloy® C-276 alloy, which is an alloy of nickel, molybdenum, and chromium), Kovar (e.g., a nickel-cobalt ferrous alloy), or another suitable material. In one embodiment, the housing may be made of stainless steel. In certain embodiments, the substrate may be secured to the housing via a metal seal, e.g., via brazing, so as to minimize gas leakage from the processing chamber environment to the external environment. In certain embodiments, an o-ring may be disposed between the substrate 702 and the housing 704. In certain embodiments, a cap configured to engage (e.g., compress) the o-ring may be disposed between the substrate 702 and the housing 704.

In the embodiment, sensor device 300 is coupled, via its electrical contacts 314, to the electrical contact pads 714 on inner region 702I of substrate 702. In one embodiment, the sensor device is coupled to the electrical contact pads 714 via a first seal 720A, which may be a metal seal formed through soldiering or brazing, e.g., with a first brazing alloy. In certain embodiments, the sensor device is secured to the substrate such that the support structure (e.g., 302) of the sensor device (e.g., 300) is in parallel orientation relative to a gas flow direction (e.g., 242). In certain embodiments, the sensor device may be secured to the substrate 702 such that the support structure of the sensor device is in perpendicular orientation relative to a gas flow direction (not shown).

In one embodiment, the middle region 702M of substrate 702 is coupled/secured to the housing 704 via a second seal 720B, which may be a metal seal, e.g., with a second brazing alloy. In certain embodiments, the substrate 702 may be secured to the housing 704 via a hermetic seal so as to minimize vacuum and/or gas leakage from the processing chamber environment and/or from gas channel 240 to the external environment.

Each of the first seal (720A) and second seal (720B), if present, may independently include Al alloy, Ag alloy, Au alloy, Ni alloy, Si alloy, Au—Ni alloy, Ni—Pd alloy, Ni—Y alloy, Ti alloy, or a combination thereof. In certain embodiments, the brazing alloy used for all seals is the same. In other embodiments, two or more different brazing alloys may be used for different seals. In one embodiment, at least one of the seals 720A, or 720B, includes a Ag—Cu as the brazing alloy. It is to be appreciate that the designation of a "first seal," "second seal," etc, should not be construed as binding as to the order of binding various components in the sensor assembly described herein and should not be construed as binding as to the total number of seals in a sensor assembly. Rather these designations are merely used for convenience to distinguish one seal from another. Exemplary method(s) for manufacturing various sensor assemblies described herein are described with more detail with respect to FIGS. 11A and 11B below.

In some embodiments, the sensor assembly (e.g., sensor assembly 700) further includes a non-conductive conformal coating one or more surfaces or on at least a portion of the sensor assembly. In some embodiments, the coating covers some or all of the sensor device (e.g., 300). In some embodiments, the coating covers some or all of the sensor region 306 and/or the interface region 304 of the sensor device 300. In some embodiments, the coating covers some or all of the sensor region 306, including some or all of the sensing element 308. In other embodiments, the conformal coating covers the sensor region 306 without covering the sensing element 308. In some embodiments, the coating covers some or all of the substrate 702. In some embodiments, the coating covers some or all of the outer region 702O, middle region 702M, and/or inner region 702I. In some embodiments, the coating covers some or all of the inner region 702I, including some or all of the electrical contact pads 714. In some embodiments, the coating covers some or all of the middle region 702M. In some embodiments, the coating covers some or all of the various seals (e.g., first seal 720A and/or second seal 720B). In some embodiments, the sensor assembly 700 is first assembled so as to form electrical contacts between all of the components of the sensor assembly (e.g., between the sensor device and the substrate), and thereafter the assembled sensor assembly is coated such that the coating covers portions of the sensor assembly that are exposed to a gas flow when the sensor assembly is coupled into a gas flow channel. In some embodiments, the coating deposited on at least a portion of sensor assembly 700 may be similar to the coating described hereinabove as suitable for coating at least a portion of sensor assembly 400 (e.g., similar in the deposition technique, the coating composition/material, and/or the coating's uniformity, conformality, porosity, architecture, and the like). In certain embodiments, sensor assembly 700 remains fully uncoated.

Figure 7E:
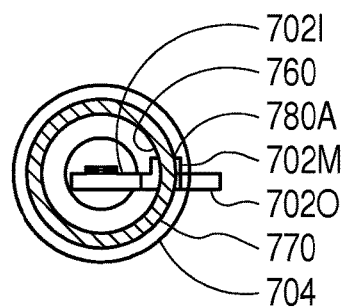
FIG. 7E illustrates a front view of section A-A in FIG. 7A.

FIG. 7E illustrates a front view of section A-A in FIG. 7A. In certain embodiments, the housing (e.g., housing 704) may include a gas-facing surface 760 and an opposing surface 770 opposite the gas-facing surface. The housing 704 may be shaped as a gas flow channel, similar to gas flow channel 240. The housing may have a larger diameter or width and/or height (if the housing has a shape other than a cylinder/tube) than the diameter of the gas flow channel (e.g., 240). The larger diameter or width and/or height of the housing 704 may be configured to provide space for the sensor assembly without restricting gas flow so that there is minimal (or substantially no) effect on the gas flow parameters that are being measured by the sensor device.

The housing 704 may have at least one slot (e.g., slot 780A) formed therethrough and shaped to receive the substrate (e.g., substrate 702). The substrate 702 may be inserted into the slot (e.g., slot 780A) such that the inner region of the substrate 702I extends from the gas-facing surface 760, e.g., into the internal environment of the gas flow channel (e.g., gas flow channel 240). In certain embodiments, substrate 702 may be inserted into slot 780A and secured to the housing 704 at the middle region 702M of the substrate 702, in a cantilever orientation, such that the inner region 702I of the substrate extends from the gas-facing surface 760 into the internal environment of the gas flow channel, and the outer region 702O of the substrate extends from the opposing surface 770 to an exterior region, as shown in the front view of section A-A in FIG. 7E.

Figure 8A:
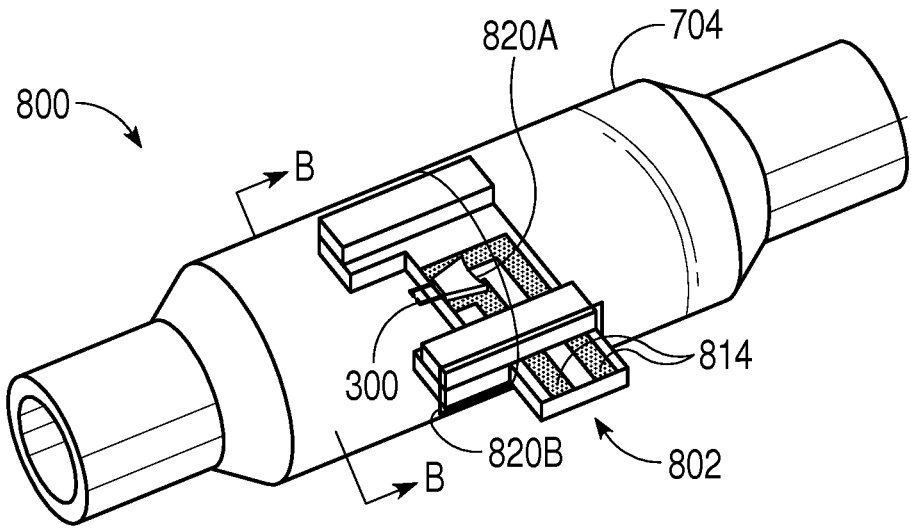
FIG. 8A illustrates a perspective view of a sensor assembly in accordance with embodiments of the present disclosure.
Figure 8B:
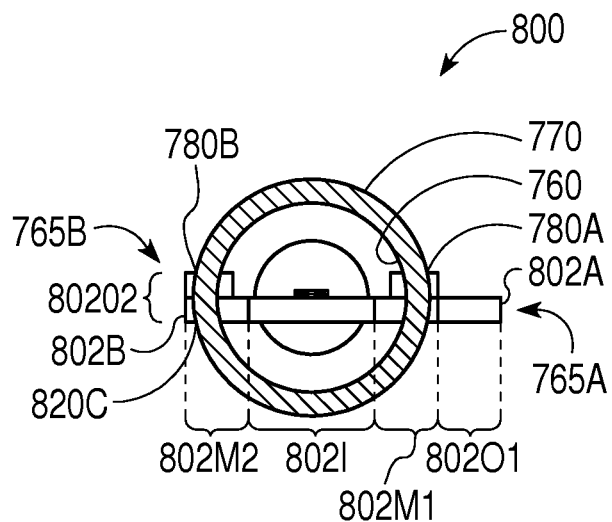
FIG. 8B illustrates a front view of cross section B-B in FIG. 7E.

In certain embodiments, as exemplified in FIGS. 8A and 8B, the housing 704 has a first slot 780A (e.g., from the gas-facing surface 760 through to the opposing surface 770 opposite the gas-facing surface) formed on a first end 765A and a second slot 780B (e.g., from the gas-facing surface 760 through to the opposing surface 770 opposite the gas-facing surface) formed on an opposing second end 765B. Such a housing could accommodate a substrate 802, which may be similar to substrate 702. In certain embodiments, substrate 802 is a multi-layered ceramic substrate. Substrate 802, like substrates 502 and 702, has the advantage that hermetic sealing is achieved between the ceramic layers of the multi-layered ceramic substrate, along with the electrical contact pads that are formed between the layers. This hermetic sealing reduces the number of location in which various components of the sensor assembly are secured via a metal seal (e.g., via brazing).

The ceramic substrate 802 may be made of any suitable plasma-resistant ceramic, which may be shaped into a suitable multi-layered ceramic in accordance with methods known to those skilled in the art, as explained hereinabove with respect to substrate 502. Similarly, ceramic substrate 802 may be made of similar materials as those described hereinabove for substrate 502.

The multi-layered ceramic substrate 802 may include a first end 802A and a second end 802B, which is opposite the first end. The first end 802A of substrate 802 may include a first outer region 802O1, an inner region 802I, and a first middle region 802M1 positioned between the first outer region 802O1 and the inner region 802I. The second end 802B of substrate 802 may include a second outer region 802O2, the same inner region 802I, and a second middle region 802M2 positioned between the second outer region 802O2 and the inner region 802I. Multi-layered ceramic substrate 802 may include electrical contact pads 814 formed between layers of the multi-layered ceramic substrate 802. Electrical contact pads 814 may extend throughout multi-layered ceramic substrate 802 from the first end 802A to the second opposing end 802B, as shown in the front view of cross section B-B in FIG. 8B.

The multi-layered ceramic substrate 802 may be secured to housing 704 at the first middle region 802M1 and at the second middle region 802M2. In certain embodiments, multi-layered ceramic substrate may be inserted into housing 704 via the first slot 780A extending throughout the full diameter (or width) of the housing 704 to the second slot 780B. The first end 802A of multi-layered ceramic substrate 802 may be disposed through the first slot 780A and the second opposing end 802B of multi-layered ceramic substrate 802 may be disposed through the second opposing slot 780B. In this configuration, the first outer region 802O1 of substrate 802 may extend from the opposing surface 770 of housing 704 on the first end 765A to an exterior region on the first end. Further, in this configuration, the second outer region 802O2 of substrate 802 may extend from the opposing surface 770 of housing 704 on the second opposing end 765B to an exterior region on the second opposing end. Further, in this configuration, the inner region 802I of the substrate 802 may extend from the gas-facing surface 760 of housing 704 on the first end 765A to the gas-facing surface 760 of housing 704 on the second end 765B. In certain embodiments, the substrate 802 may be secured to the housing (e.g., first end 765A of housing 704 to first middle region 802M1 of the substrate 802 and second end 765B of housing 704 to second middle region 802M2 of substrate 802) via a metal seal, e.g., via brazing, to form a hermetic seal so as to minimize gas leakage from the processing chamber environment to the external environment. The seals between the housing 704 and the substrate 802 (or between the housing 704 and substrate 702) may be air-tight seals to prevent gas leakage and/or vacuum leakage from gas flow channel 240. In some embodiments, the seals are metal seal formed, for example, by brazing or soldering with any of the brazing alloys described hereinbefore. Various sealing configurations may be suitably used, as will be described and illustrated in further detail with respect to FIGS. 9A-9C and 10A-10D.

In the embodiment illustrated in FIGS. 8A-8B, the sensor device 300 may be coupled/secured to the substrate 802 at the inner region 802I. As described with respect to previously illustrated sensor assemblies, sensor device 300 may be secured to substrate via a metal seal between the electrical contact 314 (on sensor device 300) and the electrical contact pads 814 on substrate 802. The electrical contacts 314 on the sensor device along with the electrical contact pads 814 on the substrate and along with one or more external devices (such as processing device 230) form together a closed circuit during operation. The electrical contact pads (e.g., 814) located between layers of the multi-layered ceramic substrate 802 may be of the same conductive material as the electrical contacts 314 on the sensor device. For instance, in one embodiment, the electrical contact pads 814 are made of platinum.

The sensor device 300 may be secured to substrate 802 such that the support structure (e.g., 302) is in parallel orientation relative to a gas flow direction (e.g., 242). In certain embodiments, the sensor device may be secured to the substrate 802 such that the support structure of the sensor device is in perpendicular orientation relative to a gas flow direction (not shown).

In some embodiments, the sensor assembly shown in FIGS. 8A-8B further includes a non-conductive conformal coating one or more surfaces or on at least a portion of the sensor assembly. In some embodiments, the coating covers some or all of the sensor device (e.g., 300). In some embodiments, the coating covers some or all of the sensor region 306 and/or the interface region 304 of the sensor device 300. In some embodiments, the coating covers some or all of the sensor region 306, including some or all of the sensing element 308. In other embodiments, the conformal coating covers the sensor region 306 without covering the sensing element 308. In some embodiments, the coating covers some or all of the substrate 802. In some embodiments, the coating covers some or all of the outer regions 802O1 and 802O2, middle regions 802M1 and 802M2, and/or inner region 802I. In some embodiments, the coating covers some or all of the inner region 802I, including some or all of the electrical contact pads 814. In some embodiments, the coating covers some or all of the various seals (e.g., first seal 820A between sensor device 300 and substrate 802, and/or second seal 820B between first middle region 802M1 of substrate 802 and first end 765A of housing 704, and/or third seal 820C between second middle region 802M2 of substrate 802 and second end 765B of housing 704). In some embodiments, the sensor assembly 800 is first assembled so as to form electrical contacts between all of the components of the sensor assembly (e.g., between the sensor device and the substrate), and thereafter the assembled sensor assembly is coated such that the coating covers portions of the sensor assembly that are exposed to a gas flow when the sensor assembly is coupled into a gas flow channel. In some embodiments, the coating deposited on at least a portion of sensor assembly 800 may be similar to the coating described hereinabove as suitable for coating at least a portion of sensor assembly 400 (e.g., similar in the deposition technique, the coating composition/material, and/or the coating's uniformity, conformality, porosity, architecture, and the like). In certain embodiments, sensor assembly 800 remains fully uncoated.

It is to be appreciate that the designation of a "first seal," "second seal," "third seal," etc, should not be construed as binding as to the order of binding various components in the sensor assembly described herein and should not be construed as binding as to the total number of seals in a sensor assembly. Rather these designations are merely used for convenience to distinguish one seal from another. Exemplary method(s) for manufacturing various sensor assemblies described herein are described with more detail with respect to FIGS. 11A and 11B below.

As indicated previously, the substrate (e.g., 702 or 802) may be bound to the housing (e.g., 704) at an intersection between the perimeter of a slot through the housing (e.g., perimeter of slot 780A or of slot 780B) and a perimeter of a middle region of the substrate (e.g., 702M, 802M1, or 802M2). However, in certain embodiments, the middle region of a substrate and the slot through a housing may be shaped to allow for face-to-face bonding between the two. It is believed, without being construed as limiting that face-to-face bonding between the substrate (e.g., at the middle region) and the housing reduces stresses that may develop during bonding. Such exemplary face-to-face bonding is illustrated in FIGS. 9A-9C and 10A-10D.

FIG. 9A illustrates a perspective view of a sensor assembly 900 in accordance with embodiments of the present disclosure. As can be seen in FIG. 9A, sensor assembly 900 may include a housing 904, which may be similar to housing 704. Housing 904 may also have a gas-facing surface 960 and an opposing surface 970 opposite the gas-facing surface. The housing 904 may also have a slot 980A therethrough. In certain embodiments, housing 904 may include a tapered region at the perimeter of slot 980A, configured to establish a flat surface at the perimeter of slot 980A, into which a middle region 902M of a substrate 902 may be bound in a parallel orientation.

FIG. 9B illustrates a perspective view of a multi-layered ceramic substrate 902, with a sensor device 300 coupled thereto at the inner region. Like other multi-layered ceramic substrates described hereinbefore, multi-layered ceramic substrate 902 may be prepared by methods known to those skilled in the art. Multi-layered ceramic 902 may have an inner region 902I to which sensor device 300 may be secured, an outer region 902O, and a middle region 902M positioned between the inner region 902I and the outer region 902O. In certain embodiments, the middle region 902M has a greater thickness and/or a greater length than the inner region 902I and/or the outer region 902O. In certain embodiments, the middle region 902M has a first surface 902M1 and a second surface 902M2 opposite the first surface. When substrate 902 is secured to housing 904, the first surface 902M1 may be proximate to the opposite surface 970 of housing 904 and may be bound thereto in a face-to-face configuration.

In certain embodiments, the shape of substrate 902 is formed with multiple ceramic layers by methods known to the skilled artisan. In certain embodiments, hermetic sealing is achieved between layers of the multi-layered ceramic substrate. In certain embodiments, electrical contact pads 914 are formed/built-in between layers of the multi-layered ceramic substrate 902 (extending throughout the entirety of the substrate 902 from the outer region 902O to the inner region 902I) and hermetic sealing is retained even with the electrical contact pads 914 between the layers.

The ceramic substrate 902 may be made of any suitable plasma-resistant ceramic, which may be shaped into a suitable multi-layered ceramic in accordance with methods known to those skilled in the art, as explained hereinabove with respect to substrate 502. Similarly, ceramic substrate 902 may be made of similar materials as those described hereinabove for substrate 502.

At least a part or the entirety of sensor assembly 900 may be coated with a protective coating as described previously for other sensor assemblies. The coating deposited on at least a portion of sensor assembly 900 may be similar to the coating described hereinabove as suitable for coating at least a portion of sensor assembly 400 (e.g., similar in the deposition technique, the coating composition/material, and/or the coating's uniformity, conformality, porosity, architecture, and the like). In certain embodiments, sensor assembly 900 may remain fully uncoated.

FIG. 9C illustrates a front view of cross section C-C in FIG. 9A. As shown in FIG. 9C, sensor assembly 900 is similar to sensor assembly 700, except for the bonding between substrate 902 and the housing 904. In sensor assembly 900, multi-layered ceramic substrate 902, onto which sensor device 300 is secured (at the inner region 902I) in a parallel orientation (relative to the gas flow 242), is inserted into slot 980A in a cantilever configuration (shown in FIG. 9C), until a first surface 902M1 of the substrate's middle region 902M contacts (face-to-face) the tapered perimeter of slot 980A (which is located on the opposing surface 970 of housing 904). The substrate assembly 902 may then be secured, e.g., via a metal seal (such as with a brazing alloy) to the housing 904, to form a hermetic seal so as to minimize leakage of gas and/or vacuum from gas channel 240 to the external environment.

Although not shown in the figures, sensor assembly 900 may be modified so that the substrate extends from one end of the housing to the opposing end of the housing, similar to sensor assembly 800. With such modification, each end of the modified substrate may be secured to each corresponding end of the housing via a similar face-to-face bonding as was described with respect to sensor assembly 900.

Figure 10A:
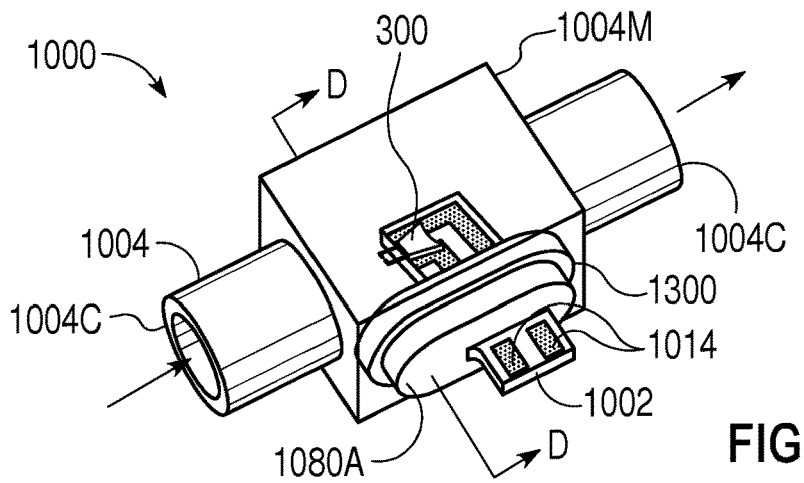
FIG. 10A illustrates a perspective view of a sensor assembly in accordance with embodiments of the present disclosure.

FIG. 10A illustrates a perspective view of a sensor assembly 1000 in accordance with embodiments of the present disclosure. As can be seen in FIG. 10A, sensor assembly 1000 may include a housing 1004, which may be similar to housing 704 and 904. The housing 1004 may also have a gas-facing surface 1060 and an opposing surface 1070 opposite the gas-facing surface. The housing 1004 may also have a slot 1080A therethrough. In certain embodiments, housing 1004 may include a tapered region at the perimeter of slot 1080A, configured to establish a flat surface at the perimeter of slot 1080A, into which a middle region 1002M of a substrate 1002 may be bound in a parallel orientation. Alternatively, as illustrated in FIG. 10A, housing 1004 may have a region 1004M with square or rectangular flat side walls onto which a middle region 1002M of a substrate 1002 may be bound in a parallel face-to-face orientation. In certain embodiments, housing 1004 may have tubular gas channels 1004C extending from two opposing side of the region 1004M with the square or rectangular flat side walls.

Figure 10B:
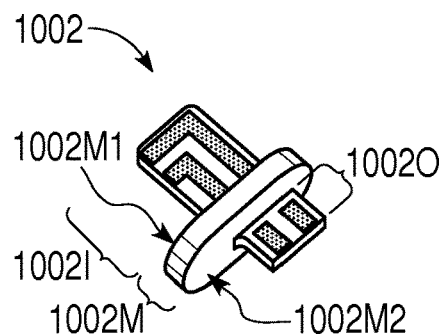
FIG. 10B illustrates a perspective view of a multi-layered ceramic substrate included in the sensor assembly of FIG. 10A, in accordance with embodiments of the present disclosure.

FIG. 10B illustrates a perspective view of a multi-layered ceramic substrate 1002. Like other multi-layered ceramic substrates described hereinbefore, multi-layered ceramic substrate 1002 may be prepared by methods known to those skilled in the art. Multi-layered ceramic 1002 may have an inner region 1002I to which sensor device 300 may be secured, an outer region 1002O, and a middle region 1002M positioned between the inner region 1002I and the outer region 1002O. In certain embodiments, the middle region 1002M has a greater thickness and/or a greater length than the inner region 1002I and/or the outer region 1002O. In certain embodiments, the middle region 1002M is shaped as a disk with round edges (e.g., an oval or a circle) and has a first surface 1002M1 and a second surface 1002M2 opposite the first surface. When substrate 1002 is secured to housing 1004, the first surface 1002M1 may be proximate to the opposite surface 1070 of housing 1004 and may be bound thereto in a face-to-face configuration.

In certain embodiments, the shape of substrate 1002 is formed with multiple ceramic layers by methods known to the skilled artisan. In certain embodiments, hermetic sealing is achieved between layers of the multi-layered ceramic substrate. In certain embodiments, electrical contact pads 1014 are formed/built-in between layers of the multi-layered ceramic substrate 1002 (extending throughout the entirety of the substrate 1002 from the outer region 1002O to the inner region 1002I) and hermetic sealing is retained even with the electrical contact pads 1014 between the layers.

The ceramic substrate 1002 may be made of any suitable plasma-resistant ceramic, which may be shaped into a suitable multi-layered ceramic in accordance with methods known to those skilled in the art, as explained hereinabove with respect to substrate 502. Similarly, ceramic substrate 1002 may be made of similar materials as those described hereinabove for substrate 502.

In certain embodiments, sensor assembly 1000 further includes an adapter/flange 1300. Adapter/flange 1300 may be shaped as a flat plate with a ring defined through its center region, the ring being configured to surround a portion of ceramic substrate 1002. Adapter/flange 1300 may have a first side 1300S1 (e.g., housing facing side) and a second side 1300S2 opposite the first side (e.g., substrate facing side). Adapter/flange 1300 may have a rounded perimeter (e.g., an oval or a circular perimeter or a rectangular shape with curved edges). Adapter/flange 1300 may be bound to housing 1004, e.g., to opposing surface 1070 of housing 1004, at, e.g., proximate to the location of slot 1080A (e.g. around the perimeter of slot 1080A). For instance, flange/adapter 1300 may be welded, e.g., via e-beam welding, to housing 1004, such that first side 1300S1 of the adapter/flange 1300 is proximate to housing 1004 (e.g., to opposing surface 1070 of housing 1004), e.g., as shown by numeral 1300D in FIG. 10D. Adapter/flange 1300 may be secured to housing 1004 in a parallel face-to-face configuration.

Adapter/flange 1300 may be made of a material with a coefficient of thermal extension that is between the coefficient of thermal expansion of the multi-layered ceramic substrate 1002 and the coefficient of thermal expansion of the housing 1004. In certain embodiments, housing 1004 has a first coefficient of thermal expansion (CTE1), the substrate 1002 has a second coefficient of thermal expansion (CTE2), and the adapter/flange 1300 has a third coefficient of thermal expansion (CTE3). In certain embodiments, CTE3 has a value that is between CTE1 and CTE2. For instance, housing 1004 may be made of stainless steel with CTE1, the dielectric multi-layered ceramic substrate may be made of a ceramic with CTE2, and the adapter/flange 1300 may be made of Kovar (a nickel-cobalt ferrous alloy) with CTE3 that is between CTE1 and CTE2. In certain embodiments, the adapter/flange 1300 comprises stainless steel, a nickel alloy, a nickel-chromium-molybdenum alloy, a nickel-cobalt-ferrous alloy, or a combination thereof. In certain embodiments, substrate 1002 is secured to adapter/flange 1300, such that the first surface 1002M1 may be proximate to the second side 1300S2 of adapter/flange 1300 and may be bound thereto in a face-to-face configuration.

Substrate 1002 may be secured to the adapter/flange 1300 (if present) or to housing 1004 (if adapter/flange 1300 is missing) via a first metal seal 1300A such as through brazing with any of the metal alloys described hereinbefore or any other suitable metal alloy. In one embodiment, substrate 1002 may be secured to adapter/flange 1300 via brazing with an Al alloy.

In certain embodiments, a back-up ring 1500 may be further disposed around a portion of substrate 1002 between the flange 1300 and the housing 1004. The back-up ring may shaped as a flat plate with a ring defined in its center region, the ring being configured to surround a portion of ceramic substrate 1002. The back-up ring may include a housing-facing side and a substrate-facing side opposite the housing-facing side. In certain embodiments, the substrate-facing side of the back-up ring may be secured to the housing-facing side of the flange/adapter 1300 via a second metal seal 1300B. Second metal seal 1300B may be a metal brazing seal formed with any of the metal alloys described hereinbefore or any other suitable metal alloy. In certain embodiments, the ceramic back-up ring 1500 is configured to reduce stress in the joint (such as in the joint between the flange/adapter 1300 and the housing 1004). Back-up ring 1500 may be secured to flange/adapter 1300 and/or to housing 1004 via a parallel face-to-face configuration.

Back-up ring 1500 may be made of a material with a coefficient of thermal extension that is between the coefficient of thermal expansion of the multi-layered ceramic substrate 1002 and the coefficient of thermal expansion of the housing 1004. In certain embodiments, back-up ring 1500 is made of a ceramic material.

In certain embodiments, upon securing the back-up ring 1500 and the adapter/flange 1300 to the substrate 1002, a sensor device (such as sensor device 300) may be secured to the inner region of the substrate 1002 via a third seal 1300C. Thereafter, the substrate 1002 with the back-up ring 1500, the adapter/flange 1300, and the sensor device 300 may be inserted into housing 1004, followed by securing the adapter/flange 1300 (e.g., via e-beam welding) to housing 1004 to form a hermetic seal so as to minimize vacuum and/or gas leakage from the gas channel 240 to the external environment.

Each of the first seal 1300A, second seal 1300B, third seal 1300C, and optionally the fourth seal 1300D (if not welded), if present, may independently include Al alloy, Ag alloy, Au alloy, Ni alloy, Si alloy, Au—Ni alloy, Ni—Pd alloy, Ni—Y alloy, Ti alloy, or a combination thereof. In certain embodiments, the brazing alloy used for all seals is the same. In other embodiments, two or more different brazing alloys may be used for different seals. It is to be appreciate that the designation of a "first seal," "second seal," "third seal," "fourth seal," etc, should not be construed as binding as to the order of binding various components in the sensor assembly described herein and should not be construed as binding as to the total number of seals in a sensor assembly. Rather these designations are merely used for convenience to distinguish one seal from another. Exemplary method(s) for manufacturing various sensor assemblies described herein are described with more detail with respect to FIGS. 11A and 11B below.

At least a part or the entirety of sensor assembly 1000 may be coated with a protective coating as described previously for other sensor assemblies. The coating deposited on at least a portion of sensor assembly 1000 may be similar to the coating described hereinabove as suitable for coating at least a portion of sensor assembly 400 (e.g., similar in the deposition technique, the coating composition/material, and/or the coating's uniformity, conformality, porosity, architecture, and the like). In certain embodiments, coating assembly 1000 may be full uncoated.

Figure 10C:
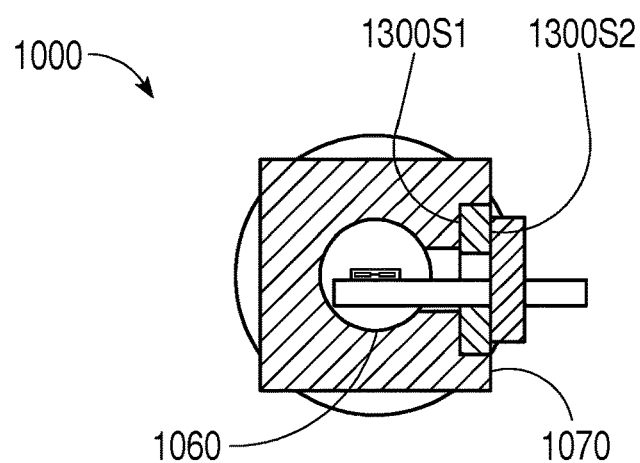
FIG. 10C illustrates a front view of section D-D in FIG. 10A.

FIG. 10C illustrates a front view of cross-section C-C of FIG. 10A. As shown in FIG. 10C, sensor assembly 1000 is similar to sensor assembly 700 and 900, except for the bonding between substrate 1002 and the housing 1004. In sensor assembly 1000, multi-layered ceramic substrate 1002, onto which sensor device 300 is secured (at the inner region 1002I) in a parallel orientation (relative to the gas flow 242), is inserted into slot 1080A in a cantilever configuration (shown in FIG. 10F), until a first surface 1002M1 of the substrate's middle region 1002M contacts (face-to-face) either a tapered perimeter of slot 1080A (not shown) or the second side 1300S2 of adapter/flange 1300 (which may be located on the opposing surface 1070 of housing 1004). The substrate assembly 1002 may then be secured, e.g., via a metal seal (such as with a brazing alloy) to the adapter/flange 1300.

Although not shown in the figures, sensor assembly 1000 may be modified so that the substrate extends from one end of the housing to the opposing end of the housing, similar to sensor assembly 800. With such modification, each end of the modified substrate may be secured to each corresponding end of the housing via a similar face-to-face bonding, through an intermediate adapter/flange, as was described with respect to sensor assembly 1000.

Figure 11A:
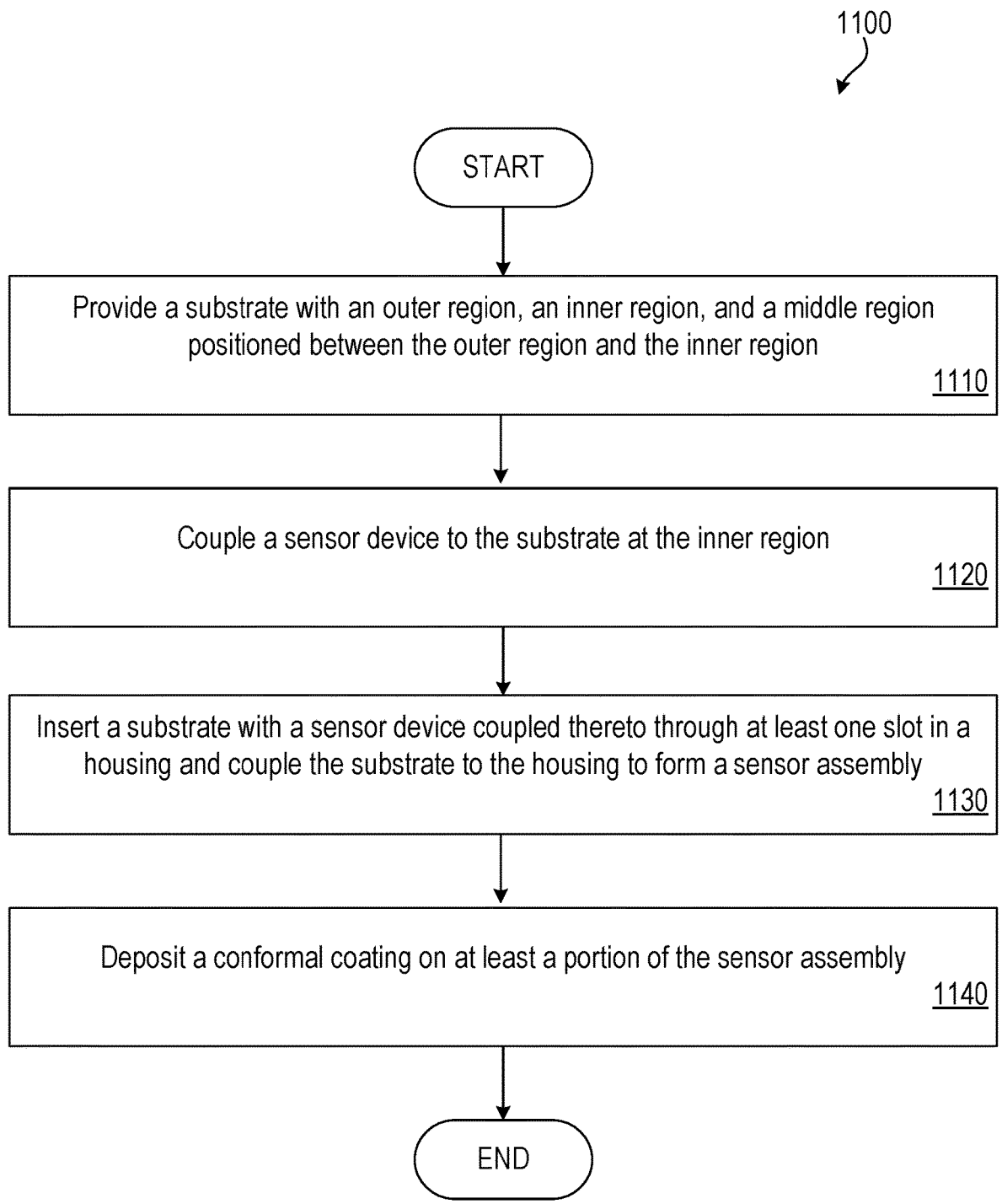
FIG. 11A illustrates a flow chart of a method of adapting a sensor device for use in a flow control apparatus in accordance with embodiments of the present disclosure.

FIG. 11A illustrates a method 1100 of adapting a sensor device for use in a flow control apparatus in accordance with embodiments of the present disclosure. At block 1110, a substrate is provided. The substrate may have an outer region, an inner region, and a middle region positioned between the outer region and the inner region, and may further have electrical contact pads on at least the inner region thereof. Such exemplary substrates were shown in sensor assemblies described hereinbefore, for example, substrates 402, 502, 602, 702, 802, 902, and 1002. In certain embodiments, prior to providing the substrate, the substrate may be machined into the shapes described hereinabove or any other suitable shape. In certain embodiments, electrical contact pads may be metallized into the inner region of the substrate. In certain embodiments, prior to providing the substrate, the substrate may be formed as a multi-layered ceramic substrate with any of the shapes described hereinbefore (or any other suitable shape) and with electrical contact pads formed between layers of the multi-layered ceramic substrate such that the electrical contact pads extend throughout the multi-layered ceramic substrate from the outer region to the inner region.

At block 1120, a sensor device, such as sensor device 300 described in FIG. 3 or any other suitable sensor device, may be coupled to the substrate at the inner region of the substrate. In some embodiments, the sensor device comprises an support structure comprising an interface region (e.g., the interface region 304) on one end of the sensor device and a sensor region (e.g., sensor region 306) on an opposite end of the sensor device. The sensor region may include a free-standing sensing element (e.g., sensing element 308) suspended at the sensor region. The sensor device may further include electrical contacts (e.g., electrical contacts 314) extending throughout the length of the elongated support structure, from the sensing element to the top of the interface region. The sensor device may be secured/coupled to the substrate such that the electrical contacts on the sensor device are in contact with the electrical contact pads on the substrate to establish a continuous and closed electric circuit for transferring the signal from the sensor device to a processing device (e.g., processing device 230).

In certain embodiments, the sensor device may be secured to the substrate by forming a first seal between the electrical contact pads on the substrate (e.g., 414, 514, 614, 714, 814, 914, or 1014) and the electrical contacts on the sensor device (e.g., 314). In certain embodiments, the sensor device in any of the sensor assemblies contemplated herein may be secured to the substrate via brazing (or any other chemical mode of attaching the sensor device to the substrate). In certain embodiments, the sensor device in any of the sensor assemblies contemplated herein may be secured to the substrate via a heat source (e.g., laser welding). The sensor device may be secured to the substrate in a perpendicular orientation (such as in sensor assemblies 400 and 500) or parallel orientation (such as in sensor assemblies 600, 700, 800, 900, and 1000).

In certain embodiments where the substrate includes conductor pins extending throughout the outer region and the middle region of the substrate and into at least a portion of the inner region of the substrate (e.g., substrate 402 and 602), the method may also include securing, e.g., with a third metal seal (such as via brazing), the conductor pins to the electrical contact pads at the inner region of the substrate (e.g., as described with sensor assemblies 400 and 600).

At block 1130, the substrate is inserted into a slot in a housing (such as any of the housings 404, 504, 604, 704, 904, or 1004 described hereinbefore) such that the inner region of the substrate extends from the gas-facing surface of the housing. In certain embodiments, the substrate is then coupled/secured to the housing with a second seal (e.g., via soldiering and/or brazing with a suitable brazing alloy) to form a sensor assembly. In certain embodiments, the substrate may be secured to the housing at the outer region of the substrate, as shown with sensor assemblies 400, 500, and 600. In certain embodiments, the substrate may be secured to the housing at the middle region of the substrate, in a cantilever configuration, as shown with sensor assemblies 700 and 900. In certain embodiments, the substrate may be inserted into two slots on two opposing ends of a housing, in an extended configuration, and may be coupled/secured to the housing at two middle regions of the substrate, as shown with sensor assembly 800. In certain embodiments, the substrate may be secured, at its middle region, to a housing via a face-to-face configuration, as shown with sensor assembly 900. In certain embodiments, the substrate may be secured, at its middle region, to an adapter/flange, via a face-to-face configuration, and the adapter/flange may be coupled (e.g., welded) to a housing, as shown with sensor assembly 1000 and described in more detail with respect to FIG. 11B.

In certain embodiments, forming one or more of the metal seals described herein (e.g., first seal, second seal, third seal, and any additional metal seals) may include brazing one component to another (e.g., brazing the sensor device to the substrate, brazing the substrate to the housing, or brazing conductor pins to the electrical contact pads). The brazing alloy for any of the seals may independently include Al alloy, Ag alloy, Au alloy, Ni alloy, Si alloy, Au—Ni alloy, Ni—Pd alloy, Ni—Y alloy, Ti alloy or a combination thereof. In certain embodiments, a further o-ring may be placed between a substrate and a housing (and optionally a further cap configured to engage or compress the o-ring may be placed between a substrate and a housing) to reinforce hermetic seal between a substrate and a housing. In certain embodiments, the seals provide for hermetic sealing so as to minimize vacuum and/or gas leakage from the gas channel 240 to an external environment (e.g., minimize leakage in the interface between a substrate and a housing and/or minimize leakage through pin holes through which conductor pins may pass).

At block 1140, a conformal coating may be deposited onto the sensor assembly to at least coat a portion the sensor assembly. In some embodiments, the conformal coating is a non-conductive material, such as a non-conductive ceramic material. In some embodiments, the conformal coating covers at least a portion of the sensing element 308. In other embodiments, the conformal coating covers the sensor region and does not coat, or minimally coats, the sensing element. In some embodiments, the coating covers some or all of the substrate (including it inner region, one or more middle regions, and one or more outer regions). In some embodiments, the coating covers some or all of the electrical contact pads on the substrate, In some embodiments, the coating covers some or all of the conductor pins extending from the substrate. In some embodiments, the coating covers some or all of the various seals (e.g., seals between the substrate and the sensor device, seals between the substrate and conductor pins, seals between conductor pins and electrical contact pads on the substrate, seals between the substrate and a housing, seals between a substrate and an adapter/flange, and the like). In some embodiments, the sensor assembly is first assembled so as to form electrical contacts between all of the components of the sensor assembly (e.g., between the sensor device and the substrate and/or between the substrate and conductor pins if present), and thereafter the assembled sensor assembly is coated such that the coating covers portions of the sensor assembly that are exposed to a gas flow when the sensor assembly is coupled into a gas flow channel. In some embodiments, the coating deposited on at least a portion of sensor assembly may be similar to the coating described hereinabove as suitable for coating at least a portion of sensor assembly 400 (e.g., similar in the deposition technique, the coating composition/material, and/or the coating's uniformity, conformality, porosity, architecture, and the like). In certain embodiments, the sensor assembly may remain fully uncoated.

In some embodiments, the conformal coating is deposited using one or more of ALD, IAD, LPPS, CVD, PS-CVD, or sputtering. In some embodiments, the conformal coating comprises a rare-earth ceramic selected from $Y_2O_3$, YZrO, $Y_xZr_yO_z$, YZrOF, $Y_3Al_5O_{12}$, $Y_4Al_2O_9$, $YF_3$, $Y_xO_yF_z$, YOF, $Er_2O_3$, $Er_3Al_5O_{12}$, $ErF_3$, $E_xO_yF_z$, ErOF, $La_2O_3$, $Lu_2O_3$, $Sc_2O_3$, $ScF_3$, ScOF, $Gd_2O_3$, $Sm_2O_3$, $Dy_2O_3$, a $Y_2O_3$—$ZrO_2$ solid solution, a ceramic comprising $Y_2Al_4O_9$ and a $Y_2O_3$—$ZrO_2$ solid solution, or combinations thereof. In some embodiments, the conformal coating comprises $Al_2O_3$. In some embodiments, the conformal coating comprises ALD deposited $Al_2O_3$. In some embodiments, the conformal coating comprises multiple layers. In some embodiments, the conformal coating has a thickness of about 10 nanometers to about 500 nanometers, or any sub-range or single value therein.

Figure 10D:
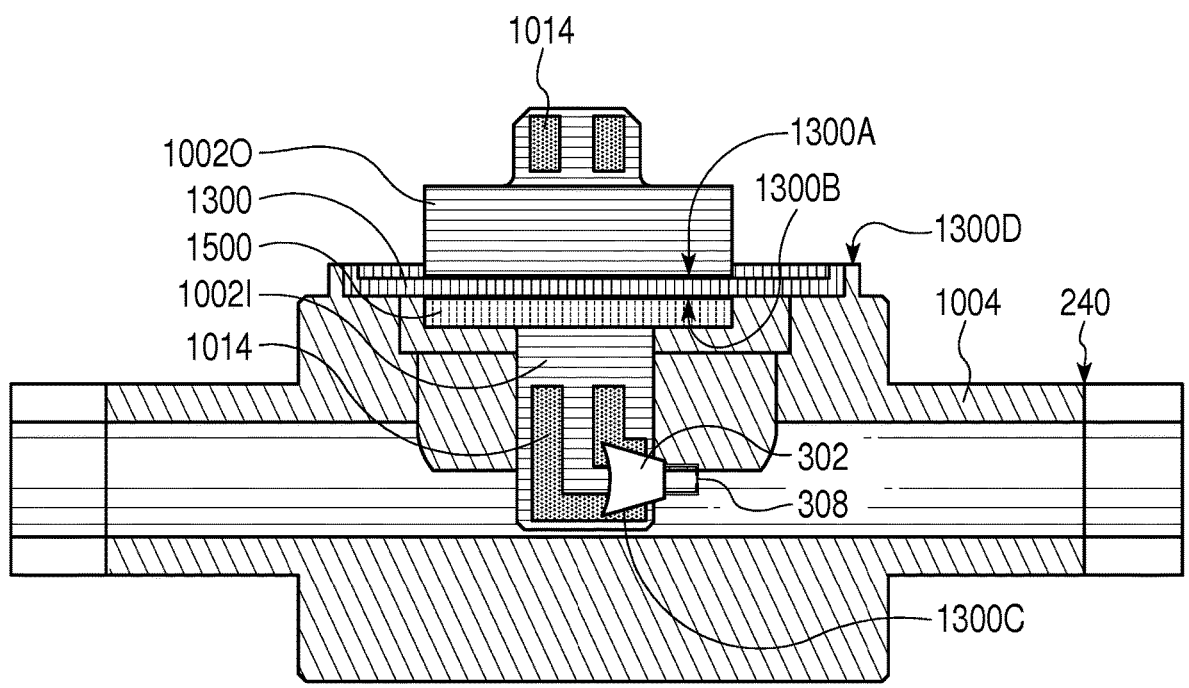
FIG. 10D illustrates a cross sectional side view of a sensor assembly in accordance with embodiments of the present disclosure.
Figure 11B:
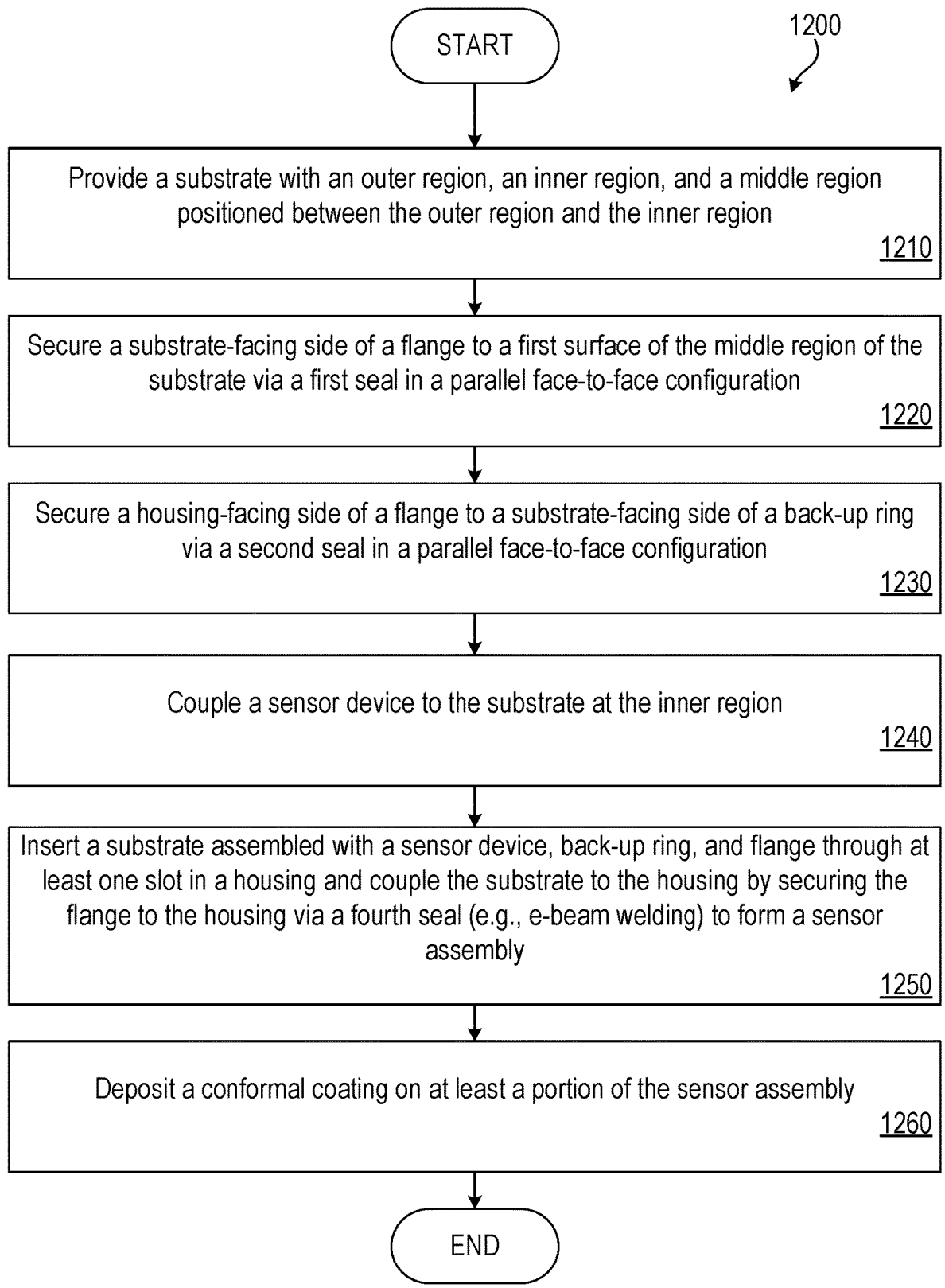
FIG. 11B illustrates a flow chart of a method of manufacturing a sensor assembly in accordance with embodiments of the present disclosure.
Figure 11C:
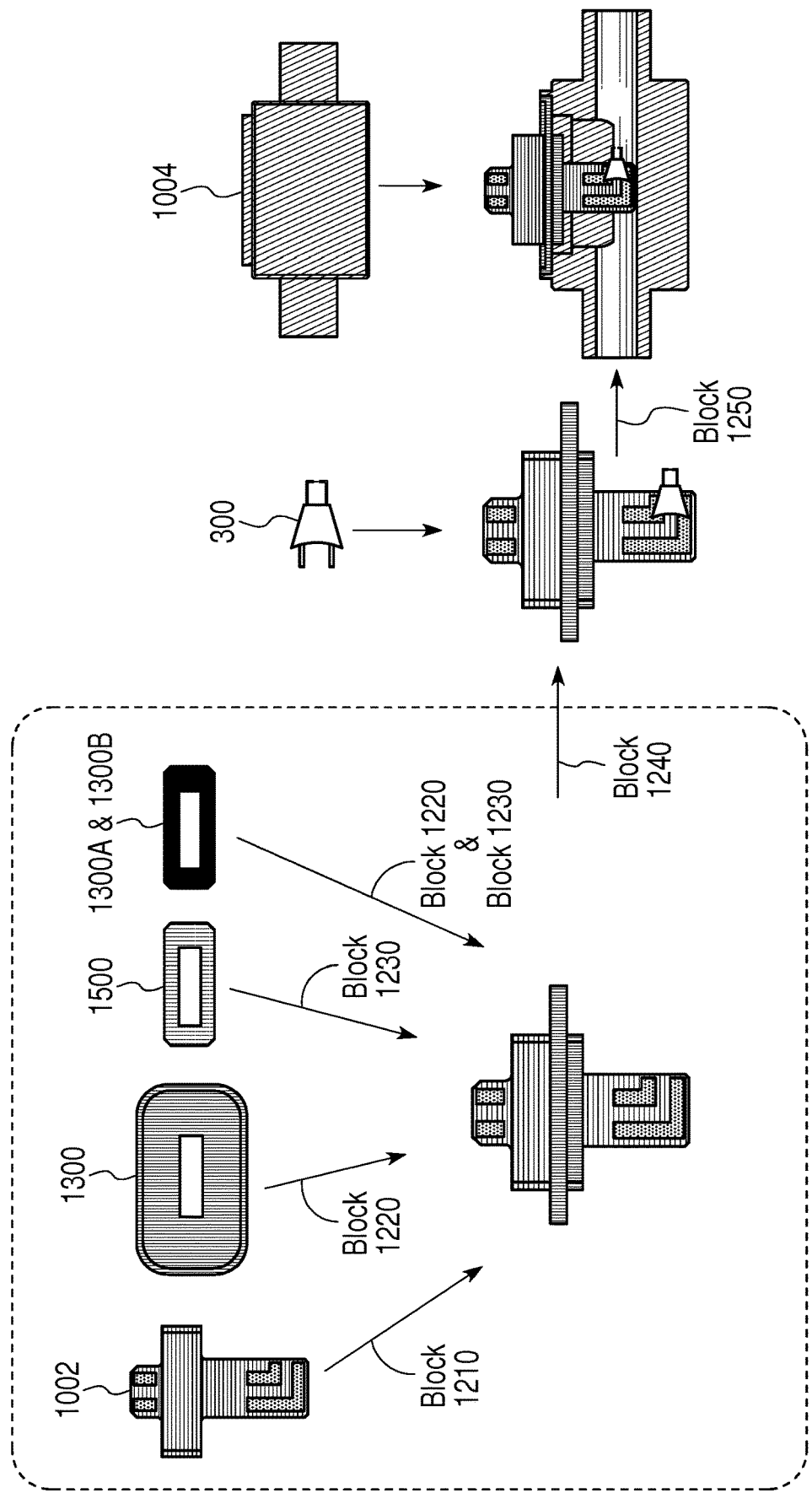
FIG. 11C illustrates a diagram of method 1200 from FIG. 11B.

In some embodiments, the method of manufacturing a sensor assembly, such as the sensor assembly depicted in FIG. 10D, follows method 1200 shown as a flow chart in FIG. 11B and as an illustration in FIG. 11C. First, per block 1210, a substrate, such as substrate 1002, with an outer region 1002O, an inner region 1002I, and a middle region 1002M (positioned between the outer region 1002O and the inner region 1002I) is provided. Thereafter, per block 1220, a metal flange/adapter 1300 may be secured to the substrate via a first seal 1300A at a parallel face-to-face configuration between the substrate-facing side of the flange/adapter 1300 and the first side of the middle region of the substrate 1002M1. Thereafter, per block 1230, a back-up ceramic ring 1500 may be secured via a second seal 1300B at a parallel face-to-face configuration between the substrate-facing side of the back-up ceramic ring and the housing-facing side of the flange/adapter 1300.

Thereafter, per block 1240, sensor device (e.g., sensor device 300) may be secured to the inner region 1002I of the substrate 1002 such that the electrical contacts on the sensor device are in contact with the electrical contact pads on the substrate to establish a continuous and closed electric circuit for transferring the signal from the sensor device to a processing device (e.g., processing device 230). In certain embodiments, the sensor device may be secured to the substrate by forming a third seal 1300C between the electrical contact pads on the substrate and the electrical contacts on the sensor device. The sensor device may be secured to the substrate in a perpendicular orientation or parallel orientation.

Thereafter, the substrate 1002 (assembled with the metal flange 1300 which is doubly brazed to the substrate on one side and to the ceramic back-up ring 1500 on the other side, and with the sensor device) may be inserted into a slot in a housing (such as 1004 described hereinbefore) such that the inner region of the substrate extends from the gas-facing surface of the housing, per block 1250. In certain embodiments, per block 1250, the metal flange 1300 is then coupled/secured to the housing with a fourth seal 1300D, which may be welded (e.g., e-beam welded), soldiered, and/or brazed with a suitable brazing alloy, to form a sensor assembly (such as sensor assembly 1000). In certain embodiments, the substrate may be secured to the housing at the middle region of the substrate, in a cantilever configuration. In certain embodiments, the substrate may be inserted into two slots on two opposing ends of a housing, in an extended configuration, and may be coupled/secured to the housing at two middle regions of the substrate. In certain embodiments, at least a portion of a substrate assembly assembled according to method 1200 may be coated as described with respect to block 1140 in method 1100 hereinabove and throughout this description with respect to various sensor assemblies. In certain embodiments, a substrate assembly assembled according to method 1200 may remain fully uncoated.

Thereafter, whether the sensor assembly is manufactured per method 1100 in FIG. 11A or method 1200 in FIG. 11B, the sensor assembly may be mounted onto a gas flow channel or attached (e.g., welded) to a tubing, for example through a suitable fitting (such as one or more VCR fittings). The sensor assembly may be further connected to one or more external devices (such as processing device 230) to form a closed gas flow measurements and control circuit. In certain embodiments, before connecting the sensor assembly to the one or more external devices, certain portions of the sensor assemblies (such as external portion of conductor pins in sensor assembly 600) may be at least partially uncoated (e.g., laser etched) to expose conductive portions that can be connected to the external device(s) to form a closed electric circuit during operation.

For simplicity of explanation, the methods of this disclosure are depicted and described as a series of acts. However, unless stated otherwise, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring instructions for performing such methods to computing devices. The term "article of manufacture," as used herein, is intended to encompass a computer program accessible from any computer-readable device or storage media.

Figure 12:
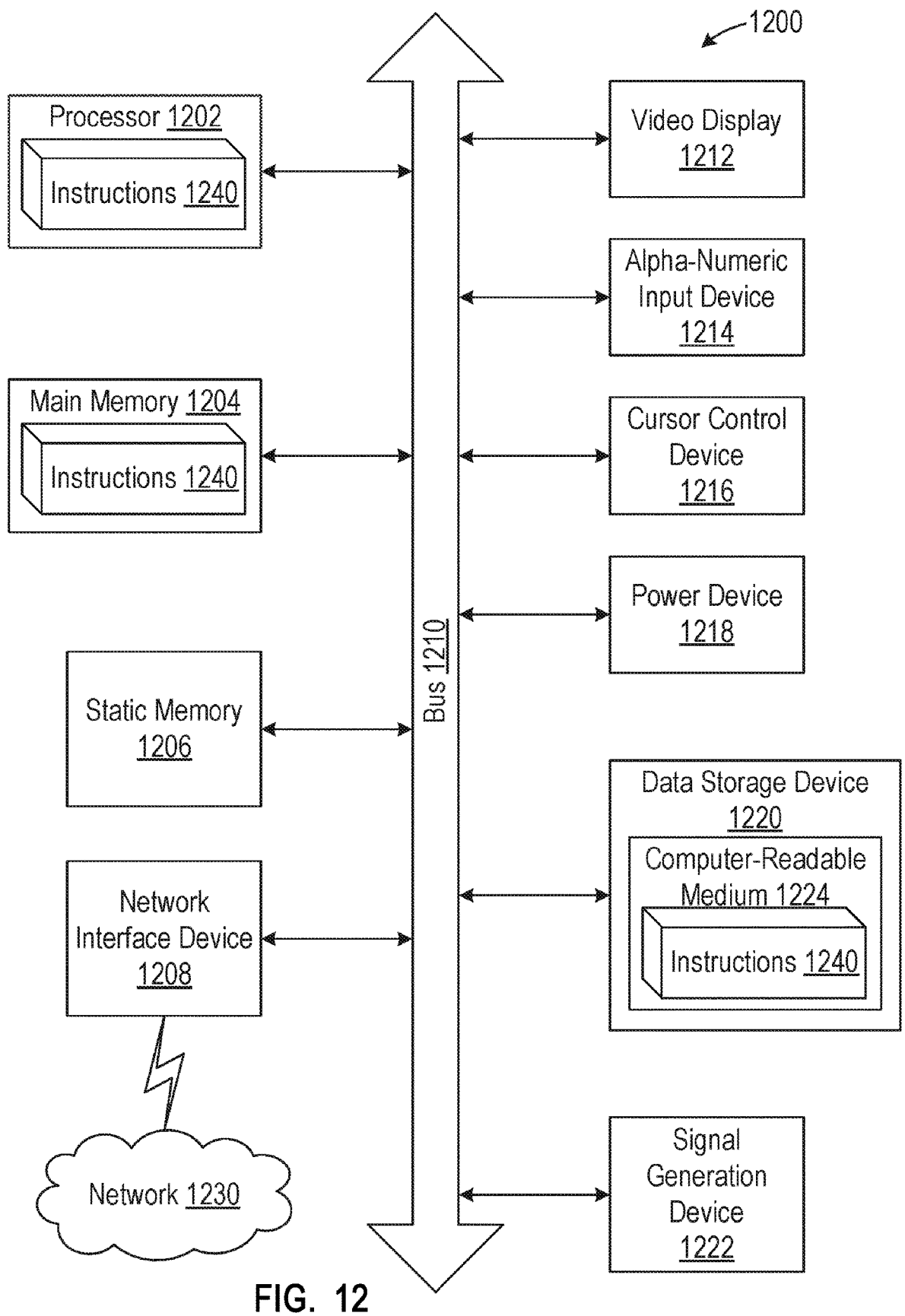
FIG. 12 is a block diagram illustrating a computer system for use in accordance with the embodiments of the present disclosure.

FIG. 12 illustrates a diagrammatic representation of a machine in the exemplary form of a computer system 1200 within which a set of instructions (e.g., for causing the machine to perform any one or more of the methodologies discussed herein) may be executed. In alternative implementations, the machine may be connected (e.g., networked) to other machines in a LAN, a WAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a PDA, a cellular telephone, a web appliance, a server, a network router, switch or bridge, or any machine capable of executing a set of instructions (sequentially or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Some or all of the components of the computer system 1200 may be utilized by or illustrative of any of the electronic components described herein (e.g., the processing device 230 or any electronic components utilized in connection with the operation of the chamber 101 or the flow modulator 210).

The exemplary computer system 1200 includes a processing device (processor) 1202, a main memory 1204 (e.g., ROM, flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a data storage device 1220, which communicate with each other via a bus 1210.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 1202 may also be one or more special-purpose processing devices such as an application specific integrated circuit (ASIC), a field programmable gate array (FPGA), a digital signal processor (DSP), network processor, or the like. The processor 1202 is configured to execute instructions 1240 for performing the operations and steps discussed herein.

The computer system 1200 may further include a network interface device 1208. The computer system 1200 also may include a video display unit 1212 (e.g., a liquid crystal display (LCD), a cathode ray tube (CRT), or a touch screen), an alphanumeric input device 1214 (e.g., a keyboard), a cursor control device 1216 (e.g., a mouse), and a signal generation device 1222 (e.g., a speaker).

Power device 1218 may monitor a power level of a battery used to power the computer system 1200 or one or more of its components. The power device 1218 may provide one or more interfaces to provide an indication of a power level, a time window remaining prior to shutdown of computer system 1200 or one or more of its components, a power consumption rate, an indicator of whether computer system is utilizing an external power source or battery power, and other power related information. In some implementations, indications related to the power device 1218 may be accessible remotely (e.g., accessible to a remote back-up management module via a network connection). In some implementations, a battery utilized by the power device 1218 may be an uninterruptable power supply (UPS) local to or remote from computer system 1200. In such implementations, the power device 1218 may provide information about a power level of the UPS.

The data storage device 1220 may include a computer-readable storage medium 1224 (e.g., a non-transitory computer-readable storage medium) on which is stored one or more sets of instructions 1240 (e.g., software) embodying any one or more of the methodologies or functions described herein. These instructions 1240 may also reside, completely or at least partially, within the main memory 1204 and/or within the processor 1202 during execution thereof by the computer system 1200, the main memory 1204, and the processor 1202 also constituting computer-readable storage media. The instructions 1240 may further be transmitted or received over a network 1230 via the network interface device 1208. While the computer-readable storage medium 1224 is shown in an exemplary implementation to be a single medium, it is to be understood that the computer-readable storage medium 1224 may include a single medium or multiple media (e.g., a centralized or distributed database, and/or associated caches and servers) that store the one or more sets of instructions 1240.

In the foregoing description, numerous details are set forth. It will be apparent, however, to one of ordinary skill in the art having the benefit of this disclosure, that the present disclosure may be practiced without these specific details. While specific embodiments have been described herein, it should be understood that they have been presented by way of example only, and not limitation. The breadth and scope of the present application should not be limited by any of the embodiments described herein, but should be defined only in accordance with the following and later-submitted claims and their equivalents. Indeed, other various implementations of and modifications to the present disclosure, in addition to those described herein, will be apparent to those of ordinary skill in the art from the foregoing description and accompanying drawings. Thus, such other implementations and modifications are intended to fall within the scope of the present disclosure.

References were made to the accompanying drawings, which form a part of the description and in which are shown, by way of illustration, specific embodiments. Although these disclosed embodiments are described in sufficient detail to enable one skilled in the art to practice the embodiments, it is to be understood that these examples are not limiting, such that other embodiments may be used and changes may be made to the disclosed embodiments without departing from their spirit and scope. For example, the blocks of the methods shown and described herein are not necessarily performed in the order indicated in some other embodiments. Additionally, in some other embodiments, the disclosed methods may include more or fewer blocks than are described. As another example, some blocks described herein as separate blocks may be combined in some other embodiments. Conversely, what may be described herein as a single block may be implemented in multiple blocks in some other embodiments. Additionally, the conjunction "or" is intended herein in the inclusive sense where appropriate unless otherwise indicated; that is, the phrase "A, B, or C" is intended to include the possibilities of "A," "B," "C," "A and B," "B and C," "A and C," and "A, B, and C."

The words "example" or "exemplary" are used herein to mean serving as an example, instance, or illustration. Any aspect or design described herein as an "example" or "exemplary" is not necessarily to be construed as preferred or advantageous over other aspects or designs. Rather, use of the words "example" or "exemplary" is intended to present concepts in a concrete fashion. When the term "about" or "approximately" is used herein, this is intended to mean that the nominal value presented is precise within ±10%.

In addition, the articles "a" and "an" as used herein and in the appended claims should generally be construed to mean "one or more" unless specified otherwise or clear from context to be directed to a singular form. Reference throughout this specification to "an embodiment," "one embodiment," "some embodiments," or "certain embodiments" indicates that a particular feature, structure, or characteristic described in connection with the embodiment is included in at least one embodiment. Thus, the appearances of the phrase "an embodiment," "one embodiment," "some embodiments," or "certain embodiments" in various locations throughout this specification are not necessarily all referring to the same embodiment.

Some portions of the detailed description may be presented in terms of algorithms and symbolic representations of operations on data bits within a computer memory. These algorithmic descriptions and representations are the manner used by those skilled in the data processing arts to most effectively convey the substance of their work to others skilled in the art. An algorithm is herein, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, or otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "receiving," "retrieving," "transmitting," "computing," "generating," "processing," "reprocessing," "adding," "subtracting," "multiplying," "dividing," "optimizing," "calibrating," "detecting," "performing," "analyzing," "determining," "enabling," "identifying," "modifying," "transforming," "applying," "causing," "storing," "comparing," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission, or display devices.

Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein, along with the full scope of equivalents to which such claims are entitled.

What is claimed is:

1. A sensor assembly comprising:
   a multi-layered ceramic substrate comprising an outer region, an inner region, and a middle region positioned between the outer region and the inner region, the multi-layered ceramic substrate comprising electrical contact pads extending from the outer region to the inner region between a first ceramic layer and a second ceramic layer;
   a housing coupled to the substrate at the middle region to form a hermetic seal; and
   a sensor device coupled to the substrate, via the electrical contact pads, at the inner region.

2. The sensor assembly of claim 1, further comprising a conformal coating deposited on at least a portion of the sensor assembly.

3. The sensor assembly of claim 1, wherein the sensor device comprises a free-standing sensing element coupled to a support structure, and wherein the sensor device is secured to the substrate such that the support structure is in parallel orientation relative to a gas flow direction.

4. The sensor assembly of claim 1, wherein the housing comprises a gas-facing surface and an opposing surface opposite the gas-facing surface, wherein the housing has a slot formed therethrough, and wherein the substrate is disposed in the slot in a cantilever orientation such that the inner region of the substrate extends from the gas-facing surface and the outer region of the substrate extends from the opposing surface to an exterior region.

5. The sensor assembly of claim 4, wherein the middle region of the substrate comprises a first surface and a second surface opposite the first surface, wherein the first surface is secured to the opposing surface of the housing in a parallel face-to-face configuration, and wherein an o-ring is disposed between the substrate and housing.

6. The sensor assembly of claim 5, wherein the sensor device is coupled to the electrical contact pads via a first seal, and wherein the first surface is secured to the opposing surface of the housing via a second seal.

7. The sensor assembly of claim 6, wherein the first seal and the second seal independently comprise Al alloy, Ag alloy, Au alloy, Ni alloy, Si alloy, Au—Ni alloy, Ni—Pd alloy, Ni—Y alloy, Ti alloy, or a combination thereof,
   wherein the electrical contact pads comprise one or more conductive metals, and
   wherein the housing comprises stainless steel, a nickel alloy, a nickel-chromium-molybdenum alloy, a nickel-cobalt-ferrous alloy, or a combination thereof.

8. The sensor assembly of claim 5, further comprising a flange secured to the opposing surface of the housing, and wherein the first surface of the middle region of the substrate is secured to the flange in a parallel face-to-face configuration.

9. The sensor assembly of claim 8, wherein the sensor device is coupled to the electrical contact pads via a first seal, wherein the flange is secured to the opposing surface of the housing with welding, and wherein the first surface is secured to the flange via a second seal.

10. The sensor assembly of claim 9, wherein the housing has a first coefficient of thermal expansion (CTE1), wherein the substrate has a second coefficient of thermal expansion (CTE2), and wherein the flange has a third coefficient of thermal expansion (CTE3), and wherein CTE3 is between CTE1 and CTE2.

11. The sensor assembly of claim 9, further comprising a back-up ring positioned between the flange and the opposing surface of the housing, wherein the back-up ring comprises a housing facing surface and a flange facing surface opposite to the housing facing surface, and wherein the flange is secured to the flange facing surface of the back-up ring via a third seal.

12. The sensor assembly of claim 11, wherein the first seal, the second seal, and the third seal independently comprise Al alloy, Ag alloy, Au alloy, Ni alloy, Si alloy, Au—Ni alloy, Ni—Pd alloy, Ni—Y alloy, Ti alloy, or a combination thereof,
  wherein the electrical contact pads comprise one or more conductive metals, and
  wherein the housing and the flange independently comprise stainless steel, a nickel alloy, a nickel-chromium-molybdenum alloy, a nickel-cobalt-ferrous alloy, or a combination thereof,
  wherein the back-up ring comprises a ceramic.

13. A flow control apparatus comprising:
  a gas flow channel defining a gas flow path;
  a flow modulating valve configured to modulate gas flow in the gas flow channel;
  a sensor assembly coupled to the gas flow channel, the sensor assembly comprising:
    a substrate comprising an outer region, an inner region, and a middle region positioned between the outer region and the inner region, the substrate further comprising electrical contact pads extending from the outer region to the inner region between a first ceramic layer and a second ceramic layer;
    a housing coupled to the substrate at the middle region or at the outer region to form a hermetic seal;
    a sensor device coupled to the substrate, via the electrical contact pads, at the inner region; and
    a conformal coating deposited on at least a portion of the sensor assembly; and
  a processing device operatively coupled to the flow modulating valve and the sensor device, the processing device being configured to adjust the flow modulating valve based on signals received from the sensor device.

* * * * *